(12) United States Patent
Lee et al.

(10) Patent No.: US 10,998,213 B2
(45) Date of Patent: May 4, 2021

(54) RETICLE TRANSPORTATION CONTAINER

(71) Applicant: Taiwan Semiconductor Manufacturing Co., Ltd., Hsin-Chu (TW)

(72) Inventors: Yu-Ching Lee, Kaohsiung (TW); Yu-Piao Fang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/876,875

(22) Filed: May 18, 2020

(65) Prior Publication Data

US 2020/0279759 A1    Sep. 3, 2020

Related U.S. Application Data

(63) Continuation of application No. 15/797,654, filed on Oct. 30, 2017, now Pat. No. 10,658,215.

(51) Int. Cl.
| | |
|---|---|
| *H01L 21/673* | (2006.01) |
| *H01L 21/677* | (2006.01) |
| *G03F 7/20* | (2006.01) |
| *G03F 1/22* | (2012.01) |
| *G03F 1/66* | (2012.01) |

(52) U.S. Cl.
CPC ............ *H01L 21/6773* (2013.01); *G03F 1/22* (2013.01); *G03F 1/66* (2013.01); *G03F 7/7015* (2013.01); *G03F 7/70741* (2013.01); *H01L 21/67353* (2013.01); *H01L 21/67359* (2013.01); *H01L 21/67373* (2013.01); *H01L 21/67379* (2013.01); *H01L 21/67383* (2013.01); *H01L 21/67386* (2013.01); *H01L 21/67733* (2013.01); *H01L 21/67769* (2013.01); *H01L 21/67772* (2013.01); *H01L 21/67721* (2013.01); *H01L 21/67724* (2013.01)

(58) Field of Classification Search
CPC ......... H01L 21/67359; H01L 21/67379; H01L 21/6779; H01L 21/67386; H01L 21/67772; H01L 21/67373
See application file for complete search history.

(56) References Cited

U.S. PATENT DOCUMENTS

| | | |
|---|---|---|
| 8,944,739 B2 | 2/2015 | Chen et al. |
| 2003/0198553 A1 | 10/2003 | Lin et al. |
| 2009/0062956 A1 | 3/2009 | Chen et al. |
| 2012/0267380 A1 | 10/2012 | Ku et al. |
| 2015/0235883 A1 | 8/2015 | Hsieh et al. |
| 2015/0323862 A1 | 11/2015 | Chang et al. |
| 2016/0276194 A1 | 9/2016 | Wang et al. |
| 2017/0060005 A1 | 3/2017 | Chang et al. |
| 2018/0102269 A1 | 4/2018 | Liu et al. |
| 2019/0131147 A1 | 5/2019 | Lee et al. |

*Primary Examiner* — Saul Rodriguez
*Assistant Examiner* — Willie Berry, Jr.
(74) *Attorney, Agent, or Firm* — Haynes and Boone, LLP

(57) ABSTRACT

A transportation container is provided with a container body constructed of a top wall, a bottom wall, a rear wall, and two sidewalls forming a front opening for loading or unloading a reticle pod into or out of the container body; a lid for opening and closing the front opening; and a lift plate above the container body configured to connect to a carrier of an overhead hoist transfer (OHT) system.

20 Claims, 16 Drawing Sheets

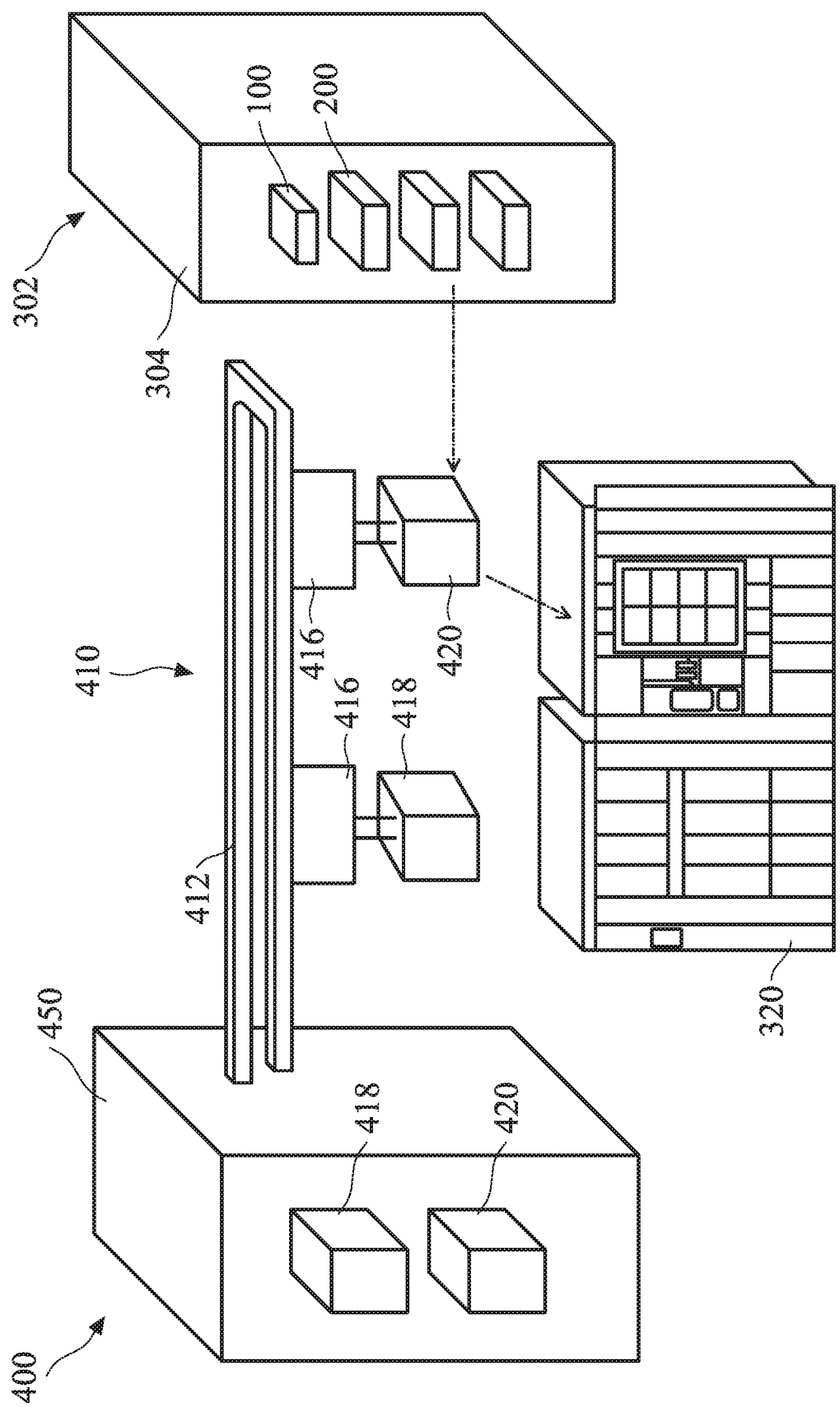

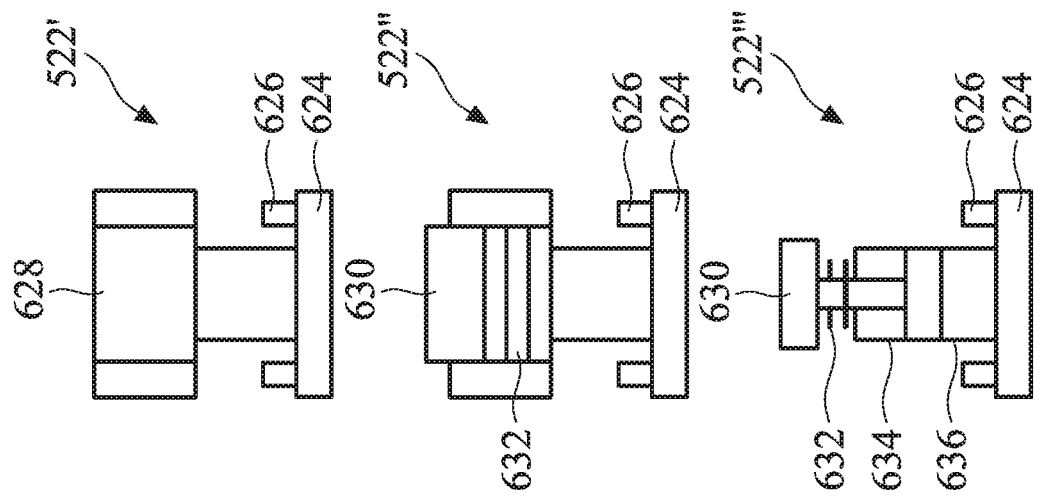
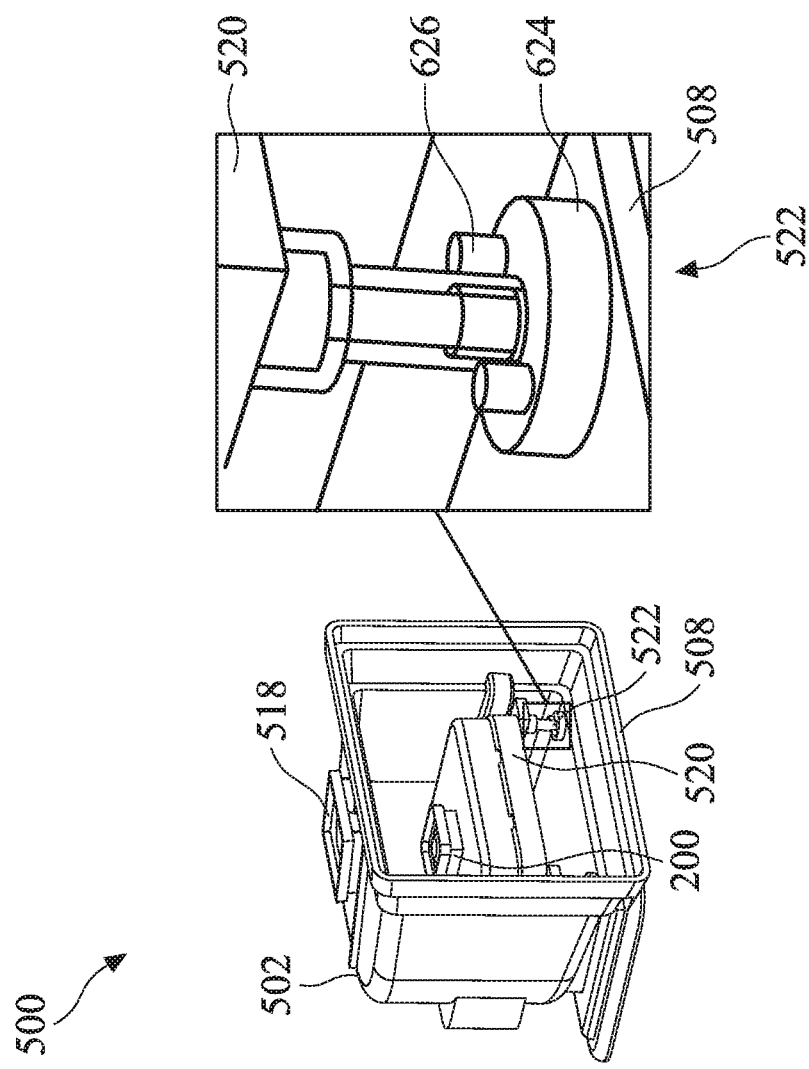
FIG. 6A
FIG. 6B

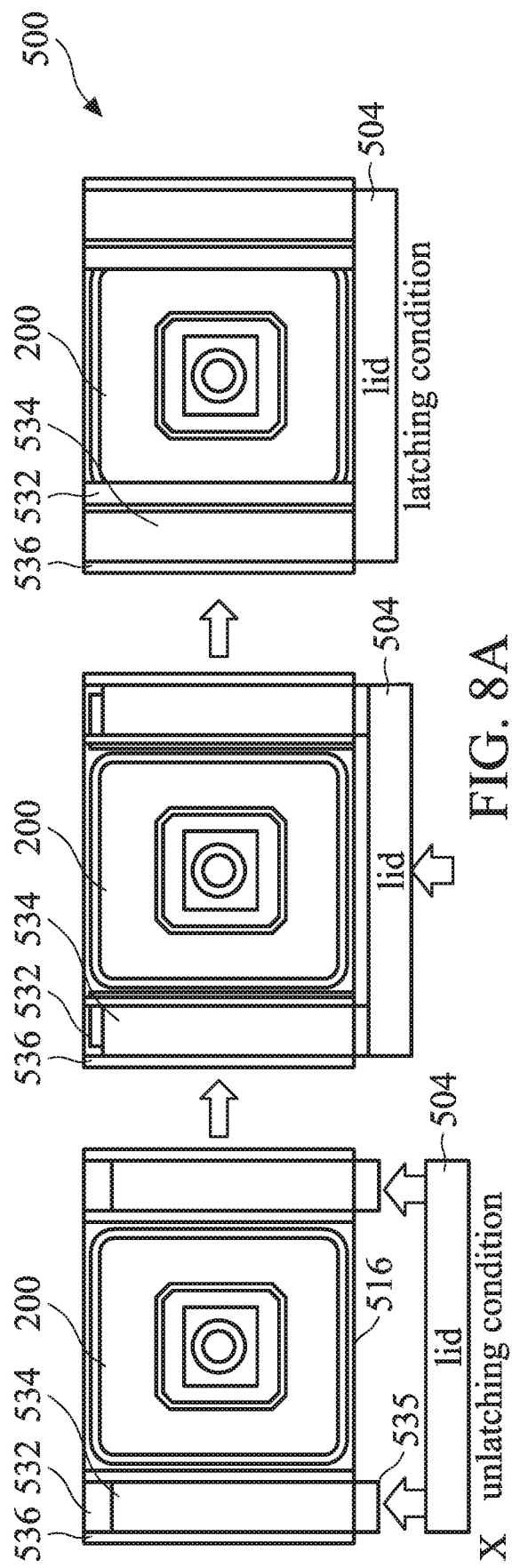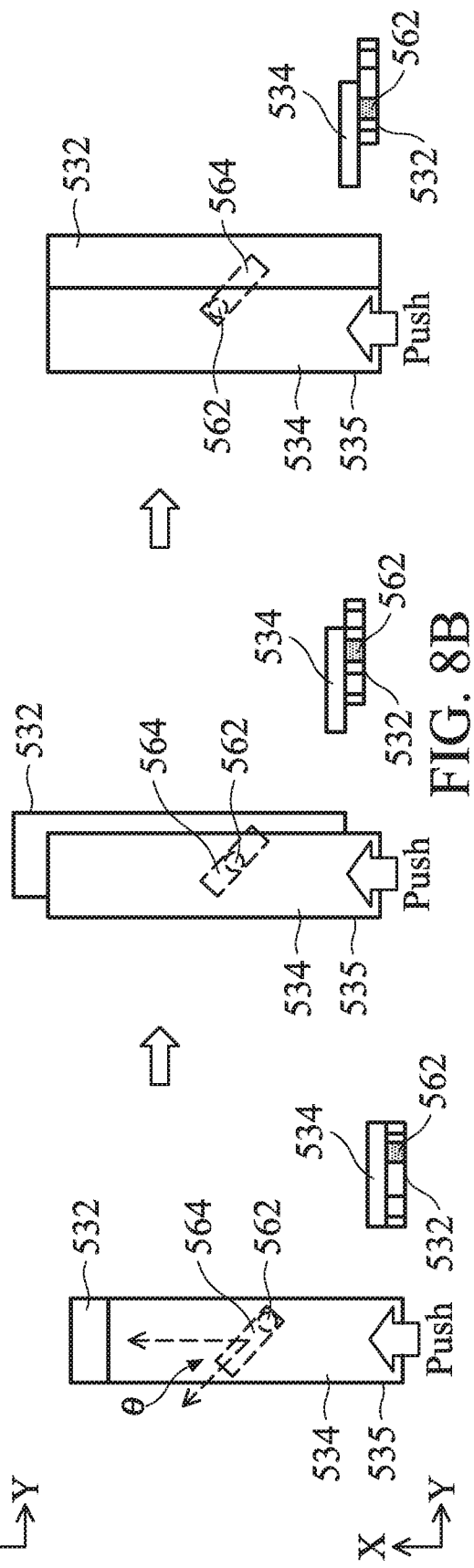
FIG. 8A
FIG. 8B

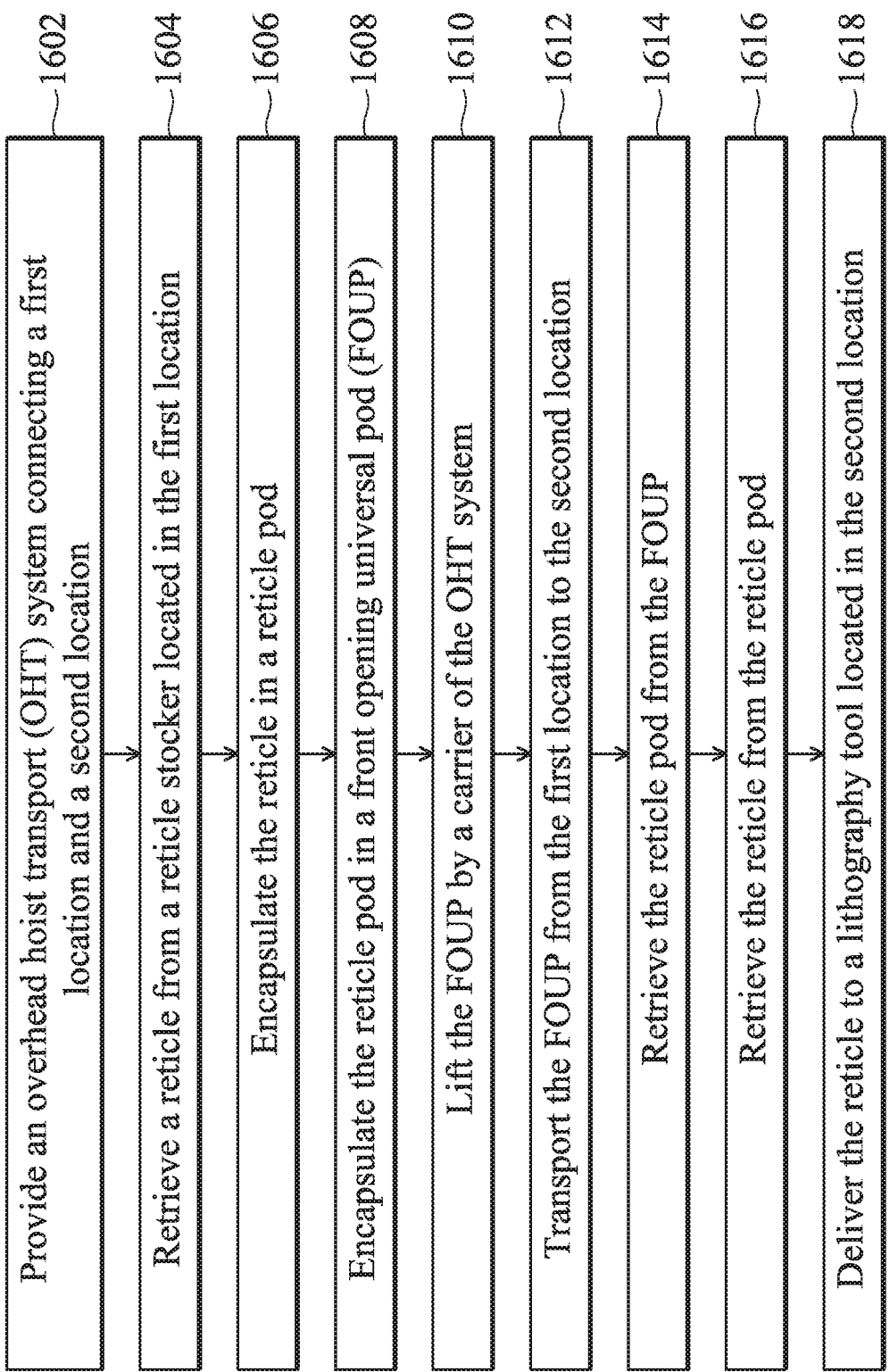

RETICLE TRANSPORTATION CONTAINER

BACKGROUND

The present application is a continuation application of U.S. application Ser. No. 15/797,654, filed Oct. 30, 2017, which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

As merely one example, semiconductor lithography processes may use lithographic templates (e.g., photomasks or reticles) to optically transfer patterns onto a substrate. Such a process may be accomplished, for example, by projection of a radiation source, through an intervening photomask or reticle, onto the substrate having a photosensitive material (e.g., photoresist) coating. The minimum feature size that may be patterned by way of such a lithography process is limited by the wavelength of the projected radiation source. In view of this, extreme ultraviolet (EUV) radiation sources and lithographic processes have been introduced. However, EUV processes are very sensitive to contamination issues. In one example, particle contamination introduced onto an EUV reticle can result in significant degradation of the lithographically transferred pattern. The particle contamination may occur during handling and transportation of EUV reticles. EUV reticle transshipment automation has been considered as part of solutions to reduce particle contamination. However, EUV reticle pods are often found mechanically incompatible with existing automatic material handling (AMH) systems. Thus, existing EUV reticle transshipment techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a diagram showing a system for reticle transshipment automation, in accordance with some embodiments.

FIGS. 6A and 6B are diagrams showing exemplary pillars in a reticle FOUP for vibration absorption, in accordance with some embodiments.

FIGS. 7A, 7B, 8A, 8B, 9, 10A, 10B, 11, 12, 13, 14 are diagrams showing latch mechanisms in a reticle FOUP, in accordance with some embodiments.

FIG. 16 is a flowchart of a method of reticle transshipment automation, in accordance with some embodiments.

DETAILED DESCRIPTION

Figure 1:
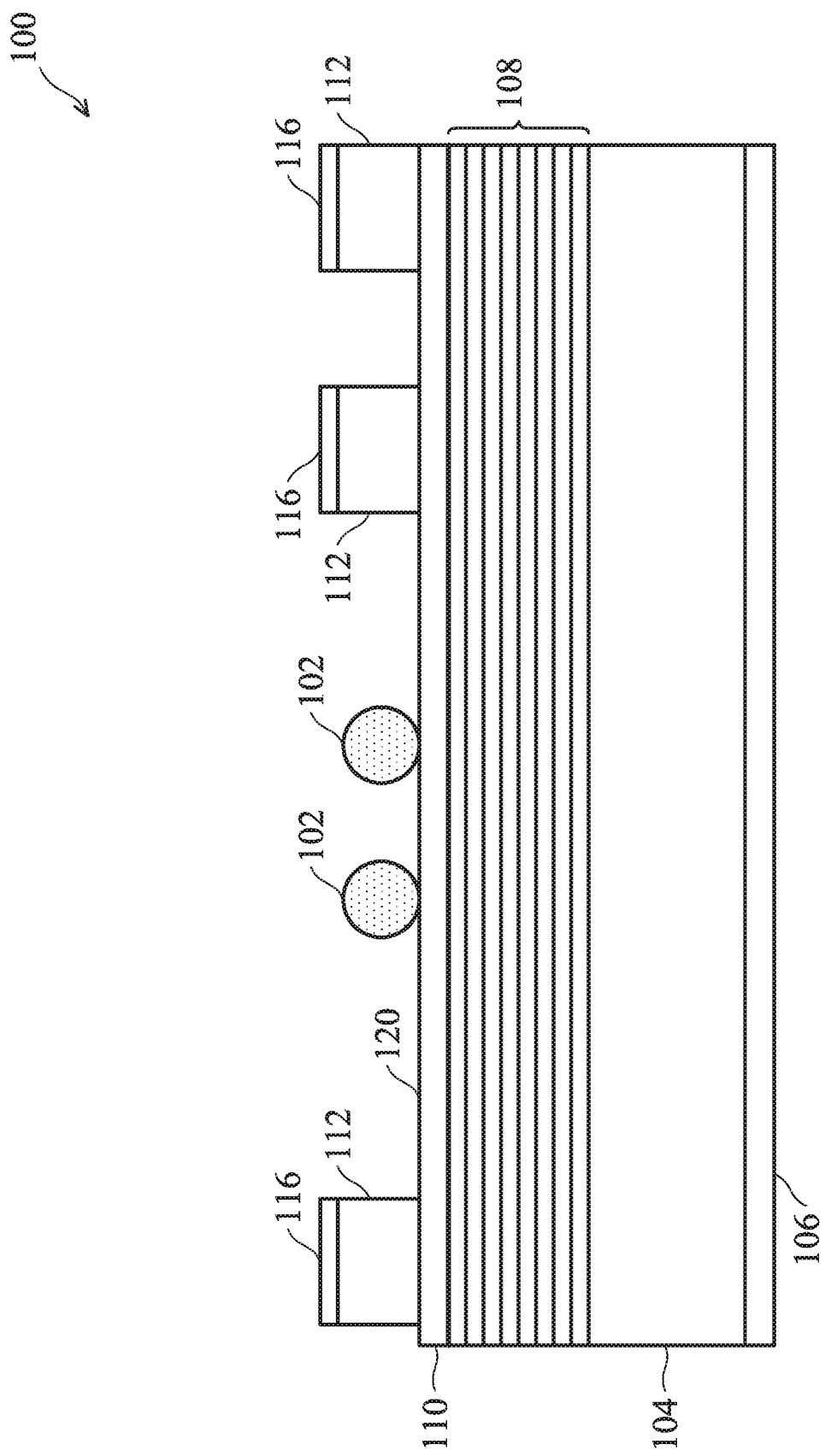
FIG. 1 is a cross-sectional view of an extreme ultraviolet (EUV) reticle, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is generally related to reticle transshipment automation, more particularly to a reticle transportation container configured to carry a reticle pod. In various embodiments, the reticle transportation container is compatible with the existing automated material handling (AMH) systems, such as an overhead hoist transfer (OHT) system, which is utilized for wafer cassette (e.g., Ø-300 mm or Ø-450 mm wafers) transportation by using front opening universal pods (FOUP).

FIG. 1 is an exemplary diagram showing a reticle 100 and particles 102 buildup on a surface of the reticle 100. According to the present example, the reticle 100 includes a substrate 104, a backside coating layer 106, a reflective multilayer 108, a capping layer 110, and one or more absorbers 112 having an anti-reflective coating (ARC) layer 116 thereon.

In one example, the reticle 100 is an EUV reticle. EUV lithography utilizes a reflective reticle rather than a transmissive reticle. EUV lithography utilizes scanners that emit light in the extreme ultraviolet (EUV) region, which is light having an extreme ultraviolet wavelength, such as 10-15 nm. In one example, the EUV source generates EUV light with wavelength at about 13.5 nm. Some EUV scanners provide 4× reduction projection printing, similar to some optical scanners, except that the EUV scanners use reflective rather than refractive optics, i.e., mirrors instead of lenses; work in the vacuum environment; and some other differences. EUV scanners provide the desired pattern on an absorption layer ("EUV" mask absorber) formed on a reflective mask. Within the EUV range, materials become highly absorbing. Thus, reflective optics rather than refractive optics are used.

In some embodiments, the substrate 104 includes a low thermal expansion material (LTEM) substrate, and the backside coating layer 106 includes a chromium nitride ($Cr_xN_y$) layer. By way of example, the reflective multilayer 108 may include molybdenum-silicon (Mo—Si) multi-layers deposited on top of the substrate 104, for example, using an ion deposition technique. In some examples each Mo—Si layer pair has a thickness of about 3 nm for the Mo layer and about 4 nm for the Si layer. In various embodiments, the capping layer 110 includes a Ru capping layer. The capping layer 110 may help to protect the reflective multilayer 108 (e.g., during mask manufacturing) and may also serve as an etch-stop layer for a subsequent absorber layer etch process. In some embodiments, the absorbers 112 include a $Ta_xN_y$ layer or a $Ta_xB_yO_zN_u$ layer, which may have a thickness of about 50-75 nm and are configured to absorb extreme ultraviolet light (e.g., with a wavelength of about 13.5 nm). In some examples, the ARC layer 116 includes at least one of a $Ta_xB_yO_zN_u$ layer, a $Hf_xO_y$ layer, or a $Si_xO_yN_z$ layer. As shown in FIG. 1, particles 102 may be unintentionally deposited on the surface of the reticle 100, such as the front surface 120, and can result in degradation of lithographically transferred patterns. While the particles 102 are illustrated as having a circular shape, it will be understood that other particle shapes and sizes are possible. The particles 102 may be introduced in a variety of ways, such as during handling and/or transportation of the reticle 100.

Figure 2:
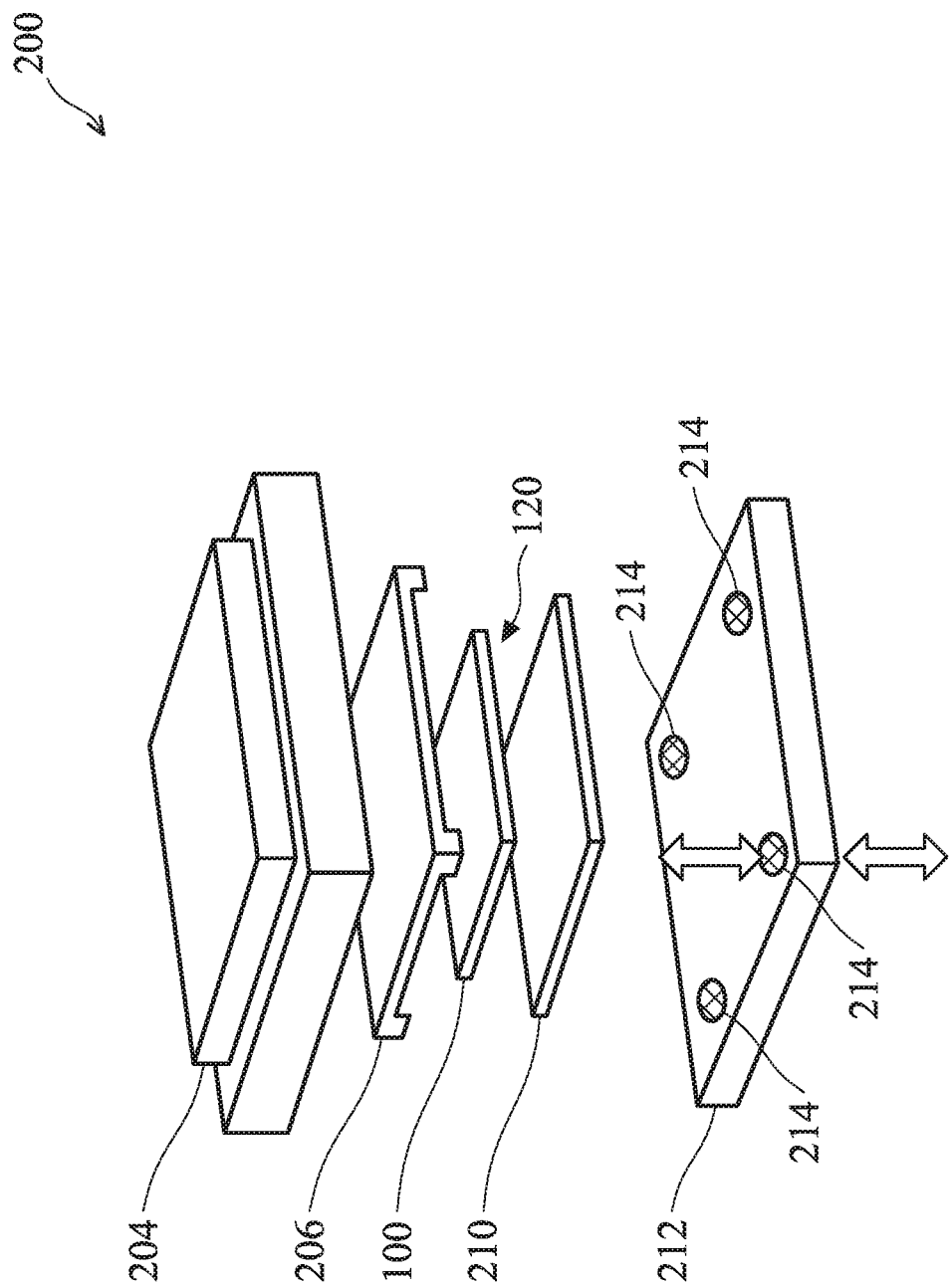
FIG. 2 is a diagram showing an exemplary EUV reticle pod, in accordance with some embodiments.

To protect the reticle 100 from damage and particle contamination during reticle handling and transportation, a reticle pod may be used to encapsulate the reticle 100. FIG. 2 is an exemplary diagram showing a reticle pod 200. In some embodiments, the reticle pod 200 is an EUV reticle pod. As described herein, the reticle pod 200 may be a dual pod carrier including an outer pod and an inner pod. The outer pod includes an outer pod base 212 and an outer pot shell 204, and the inner pod includes an inner baseplate 210 and an inner cover 206. The reticle 100 is housed within the inner pod between the inner baseplate 210 and the inner cover 206. Additionally, in some embodiments, the reticle 100 is oriented face-down within the inner pod, leaving a small gap between the front surface 120 of the reticle 100 and the inner baseplate 210, to minimize particle contamination of the front surface 120. In some embodiments, the inner pod cover 206 includes one or more openings (not shown) to allow for a flow of gas within the inner pod for cleaning purpose. The gas may be directed into the reticle pod 200 by way of one or more of ports 214 on the outer pod base 212.

Figure 3:
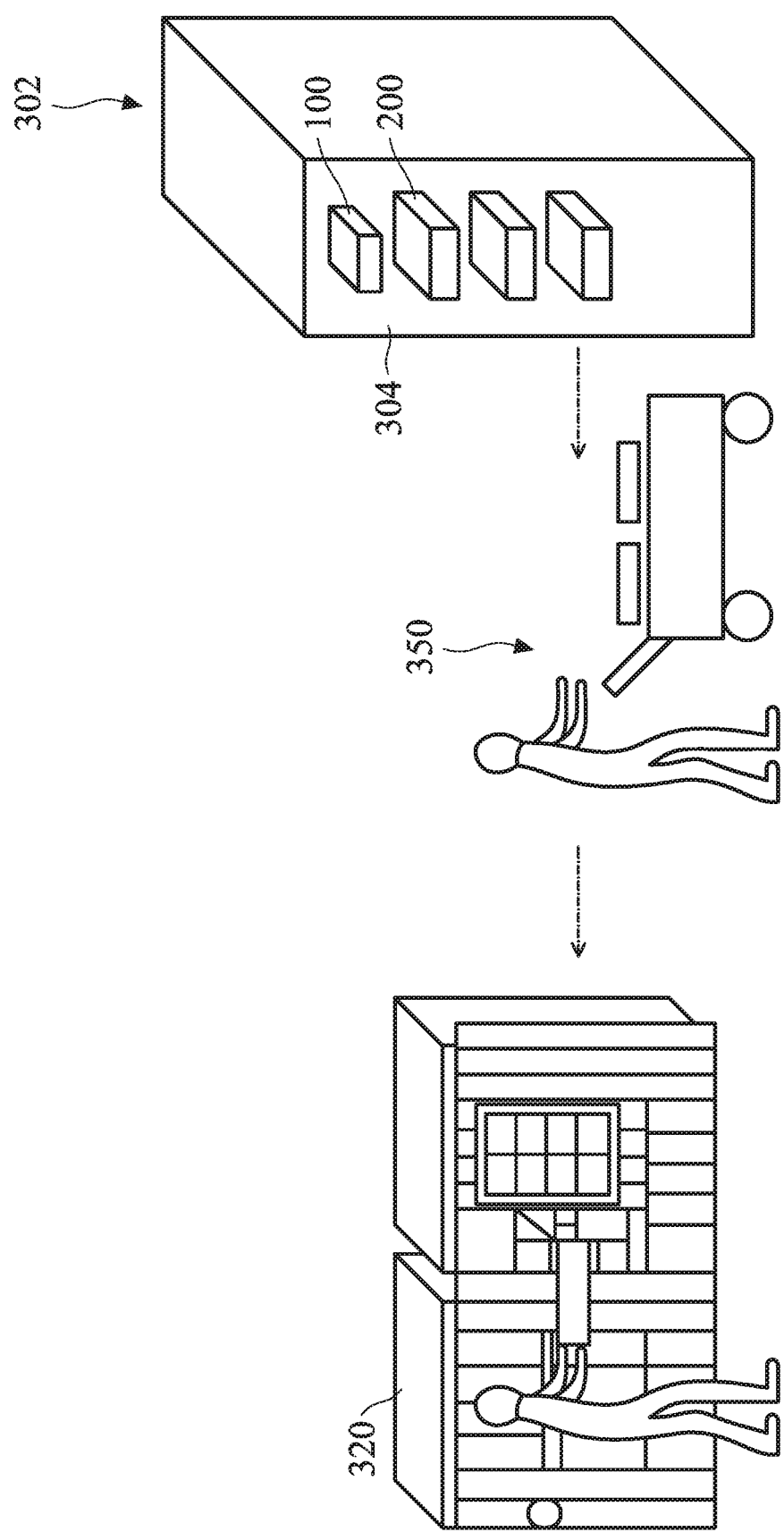
FIG. 3 is a diagram showing an exemplary reticle transportation method, in accordance with some embodiments.

At various times throughout a semiconductor process, the reticle pod 200, including the reticle 100, may be stored in a reticle stocker 302 located inside a semiconductor fabrication facility (FAB). As illustrated in FIG. 3, the reticle stocker 302 includes a stocker housing 304. At least one reticle pod 200 is provided within the stocker housing 304 for storing at least one reticle 100. The stocker housing 304 may simultaneously house a plurality of reticle pods 200, and in turn house a plurality of reticles 100. The reticle stocker 302 also includes one or more loadports for insertion or removal of the reticle pods 200 into or out of the stocker housing 304.

Still referring to FIG. 3, the reticle pod 200, including the reticle 100, may need to transport to multiple lithography tools 320 at various times throughout a semiconductor process. Lithography tools 320 can be any type of lithography processing, metrology, inspection, cleaning, testing tools, or other suitable tools. For example, a lithography tool 320 can be an EUV scanner or an EUV reticle cleaning chamber. The lithography tool 320 includes one or more loadports to facilitate insertion or removal of the reticle pod 200 into or out of the lithography tool 320. The lithography tools 320 are located inside various facilities of the FAB.

The reticle stocker 302 and the lithography tool 320 may be spaced apart, such as in different cleanrooms at the same floor or at different floors. In some scenarios, the reticle stocker 302 and the lithography tool 320 may be located in different buildings of the FAB. The reticle pod 200 needs to transport between the reticle stocker 302 and the lithography tool 320. Manual reticle pod transportation 350 is sometimes found in the FAB due to a lack of automatic transportation mechanism dedicated to reticle pods. However, the manual reticle pod transportation 350 introduces some levels of vibration and uneven acceleration/deceleration during the material handling. It imposes a risk that abraded particles may arise during a transshipment due to frictions between the reticle pod 200 and the reticle 100, which may pollute surfaces of the reticle 100. The illustrated transportation in FIG. 3 between the retile stocker 302 and the lithography tool 320 is merely an example. The transportation may also occur among a plurality of lithography tools 320 that are spaced apart in different cleanrooms, floors, and/or buildings of the FAB.

On the other hand, semiconductor wafers are typically stored and transported by an automated material handling (AMH) system. The AMH system includes numerous types of automated vehicles for moving and transporting the wafer carriers throughout the FAB during manufacturing processes. This can include for example automatic guided vehicles (AGVs), personal guided vehicles (PGVs), rail guided vehicles (RGVs), overhead shuttles (OHSs), and overhead hoist transport (OHT) systems. The OHT systems include a network of OHT rails (or tracks) connecting intra-bays and/or inter-bays spreading out in the FAB, even among different buildings. A need exists to allow the reticle pods 200 to also travel along the OHT rails otherwise for wafers carriers, which constitutes an economical solution for reticle transshipment automation without spatial and monetary requirements for rebuilding separate OHT systems dedicated to reticle pods only.

FIG. 4 is a schematic perspective diagram showing an exemplary embodiment of an AMH system 400 with reticle transportation container compatible with OHT rails, which allows the usage of existing OHT rails for concurrent reticle pod transportation and wafer cassette transportation.

In some embodiments, the AMH system 400 includes one or more OHT systems 410, which includes a network of stationary rails (or tracks) 412 operable to guide the movement of one or more OHT carriers 416 supported and suspended from the rails 412. The OHT carriers 416 may be wheeled OHT vehicles. In some embodiments, the rails 412 are monorails that are mounted to and suspended from the ceiling and/or walls of the FAB. Rails 412 may have any suitable cross-sectional configuration as will be appreciated by those in the art so long as the OHT carriers 416 are appropriately supported from the rails for rolling motion. Multiple semiconductor wafers are typically stored and transported together in a wafer transportation container 418 by the AMH system between loadports of different wafer processing tools during semiconductor fabrication processes. The wafer transportation container 418 may include standard mechanical interface (SMIF) pods which can hold a plurality of wafers (e.g., Ø-200 mm or Ø-8 inch), or front opening unified pods (FOUP) which can hold larger Ø-300 mm (Ø-12 inch) or Ø-450 mm (Ø-18 inch) wafers. For example, each wafer carrier 418 may house on the order of approximately 25 wafers. In the illustrated embodiment in FIG. 4, the wafer transportation container 418 is a FOUP for holding multiple Ø-300 mm wafers, also referred to as the wafer FOUP 418. OHT carriers 416 are operable to transport the wafer FOUP 418 through the FAB for intra-bay and/or inter-bay transshipment.

Still referring to FIG. 4, besides the wafer FOUP 418, one or more reticle transportation containers 420 are also coupled to the OHT rails 412 through other OHT carriers 416. In some embodiments, the reticle transportation container 420 has external surfaces substantially conforming to a wafer FOUP standard. The reticle transportation container 420 may be referred to as the reticle FOUP 420. The reticle FOUP 420 further equips with an internal platform configured to receive a reticle pod 200 for storing and transporting. The internal platform has features to secure the reticle pod 200 inside the reticle FOUP 420, which will be described further in details later. In the illustrated embodiment in FIG. 4, the retile pod 200 is an EUV reticle pod, and the reticle FOUP 420 is in turn an EUV reticle FOUP. The reticle FOUP 420 has a lifting apparatus (e.g., a lift plate) for grasping by grippers of an OHT vehicle hoist mechanism. By conforming to a wafer FOUP standard, the reticle FOUP 420 has the compatibility to transport through the OHT system as well as the wafer FOUP 418. The OHT carriers 416 are operable to pick up, raise/lower, hold, articulate, and release either the wafer FOUP 418 or the reticle FOUP 420 in a generally horizontal or lateral direction from one location to another within the FAB. For example, the reticle FOUP 418 can receive a reticle pod 200 from the reticle stocker 302 located in one building, then transport to a lithography tool 320 located in another building, such as an EUV scanner, along the OHT rails 412. Concurrently, a plurality of semiconductor wafers is also delivered to the lithography tool 320 in the wafer FOUP 418 along the OHT rails 412.

In some embodiments, the wafer FOUP 418 and the reticle FOUP 420 are stored together in one FOUP stocker 450. Each FOUP has a label, such as a sticker printed with serial number or a radio frequency identification (RFID) label, attached to the FOUP body to help the AMH system 400 to identify a specific wafer FOUP or a specific reticle FOUP. In some alternative embodiments, wafer FOUPs and reticle FOUPs are stored separately, such as in a wafer FOUP stocker and a reticle FOUP stocker, respectively.

Figure 5B:
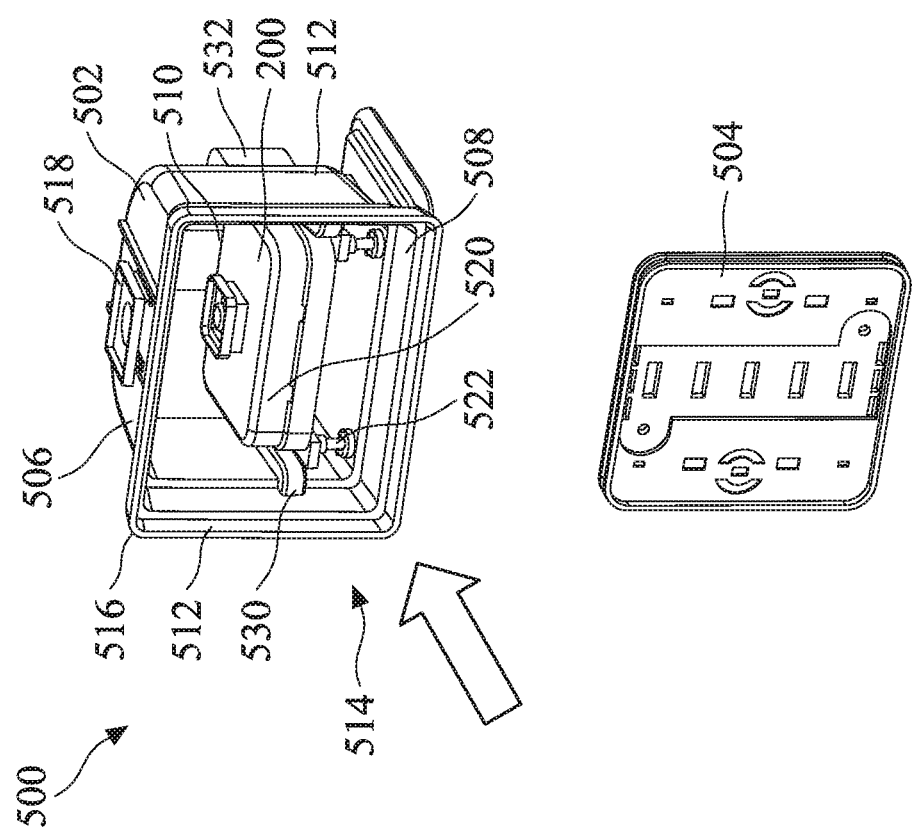
FIGS. 5A and 5B are diagrams showing an exemplary reticle front opening unified pod (FOUP), in accordance with some embodiments.
Figure 5A:
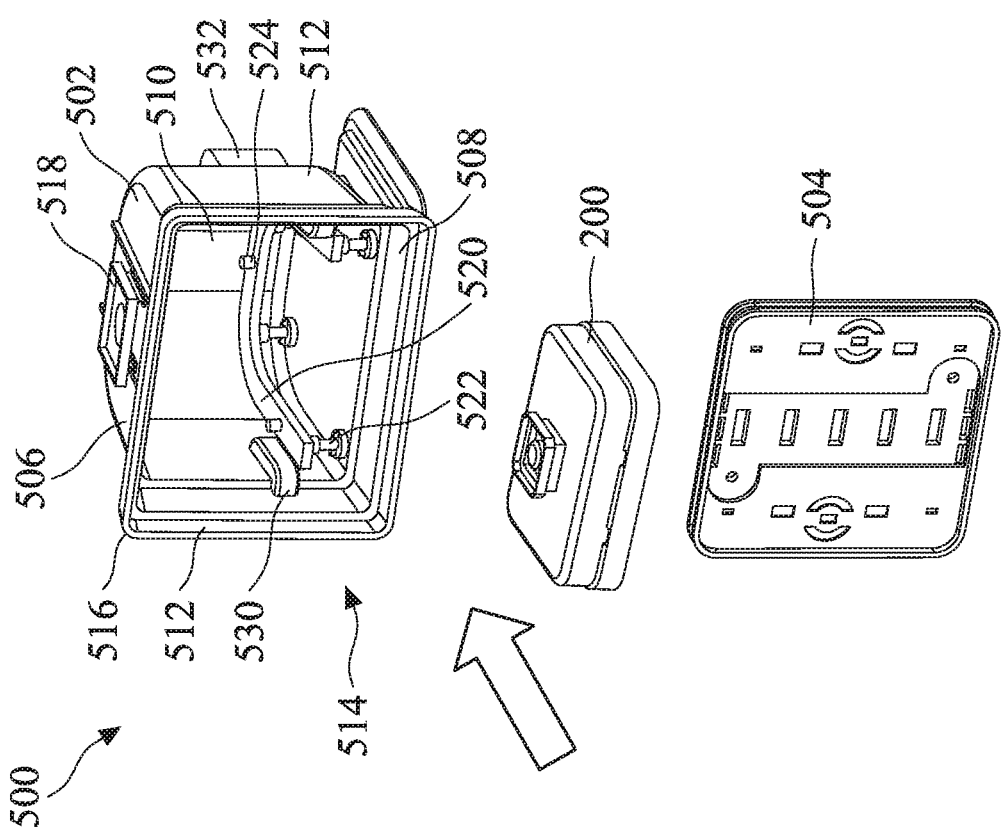

FIGS. 5A and 5B show perspective views of an exemplary reticle FOUP 500 before and after a reticle pod 200 housed in its compartment. The reticle FOUP 500 comprises a body 502 and a lid 504. The body 502 includes a top plate 506, a bottom plate 508, a rear wall 510, and two sidewalls 512, which collectively define a compartment 514 with a front opening. In some embodiments, the front opening is provided with a flange surface 516, adapted to be placed sealingly against the lid 504. The reticle FOUP 500 has a lift plate 518 on top of the body 502. The lift plate 518 is compatible with the standards of an OHT system to be lifted up by an OHT carrier. Inside the compartment 514, the reticle FOUP 500 comprises a receiving stage 520 to accommodate a reticle pod 200. The receiving stage 520 may be in a shape of a rack or a plate. The receiving stage 520 is mounted on pillars 522 extended from the bottom plate 508. In some embodiments, the receiving stage 520 is provided with pod positioning pins 524 to horizontally secure the reticle pod 200 on the receiving stage 520. The sizes and positions of the pod positioning pins 524 are matched to the exterior bottom surface of the reticle pod 200, allowing the pins to engage with the bottom surface to secure the reticle pod 200 from under. In the illustrated embodiment, the receiving stage 520 includes three pod positioning pins 524, located on left, right, and rear portions of the receiving stage 520, respectively.

The reticle FOUP 500 further has a latch mechanism 530 inside the compartment 514. As will be described further in details later, the latch mechanism 530 can be driven by the lid 504 to latch the reticle pod 200 on the receiving stage 520. In various embodiments, the bottom mechanical interface of the reticle FOUP 500 may be identical to that of a standard Ø-300 mm or Ø-450 mm wafer FOUP, at least in features relevant to interfacing with other elements of the OHT system. Similarly, other critical outside dimensions of the reticle FOUP 500 may fall within the dimensions of the envelope of a standard Ø-300 mm or Ø-450 mm wafer FOUP. In some embodiments, if depth of the reticle pod 200 is larger than the depth of a standard wafer FOUP, the body 502 may have a convex 532 to expand the depth of the compartment 514 to fit in the reticle pod 200. The convex 532 may locate on sidewalls 512 and be above the receiving stage 520 in some embodiments.

The reticle FOUP 500 may have other features. In some embodiments, the body 502 has a pair of carrying handles (not shown) on the sidewalls 512. In some embodiments, the lid 504 has a gas valve (not shown) to adjust interior air pressure when the compartment 514 is sealed by the lid 504. The body 502 and the lid 504 may be injection molded with a molding material containing a predetermined resin. The predetermined resin in the molding material includes, for example, polycarbonate, polyether ether ketone, polyether imide, polybutylene terephthalate, or thermoplastic elastomer composed of polyester-based, polystyrene-based or polyolefin-based one etc., polyacetal, liquid crystal polymer, a cyclic olefin resin and the like, which are excellent in a mechanical property, heat resistance and the like. To the predetermined resin, carbon, carbon fibers, metal fibers, carbon nanotubes, conductive polymers, antistatic agents, fire retardant or the like is selectively added as necessary.

FIGS. 6A and 6B illustrate different embodiments of the pillars 522. The reticle FOUP 500 may have one or more pillars 522. In the illustrated embodiment in FIG. 6A, the reticle FOUP 500 has four pillars 522 installed on the bottom plate 508. The pillars 522 give support to the receiving stage 520 mounted above. Each pillar 522 has a base 624 mounted on the bottom plate 508, for example, through screws 626. The pillars 522 also provide vibration (or shock) absorption to the receiving stage 520 for damping during reticle pod transshipment. In some embodiments, the vibration absorption is provided by incorporating elastic mechanism in the pillars 522. FIG. 6B illustrates several embodiments of the pillars 522 (e.g., pillars 522', 522", and 522''') with various elastic mechanisms. In an example, the pillar 522' has a rubber component 628 on the top for absorbing vibration. The rubber component 628 may be a polyurethane elastomer in some embodiments. In another example, the pillar 522" has a slider 630 loaded on a spring 632, which also provides vibration absorption. The spring 632 may have an elastic coefficient from about 4 N/cm to about 10 N/cm in some embodiments. In yet another example, the pillar 522''' has a hydraulic cylinder 634 containing fluid 636 (e.g., mechanic oil). The slider 630 is moveable along the hydraulic cylinder 634 with a spring 632 loaded in between, which is considered as a hydraulic vibration absorber. The fluid 636 may have a kinematic viscosity from about $17 \times 10^{-6}$ m$^2$/s to about $23 \times 10^{-6}$ m$^2$/s in some embodiments.

Figure 7A:
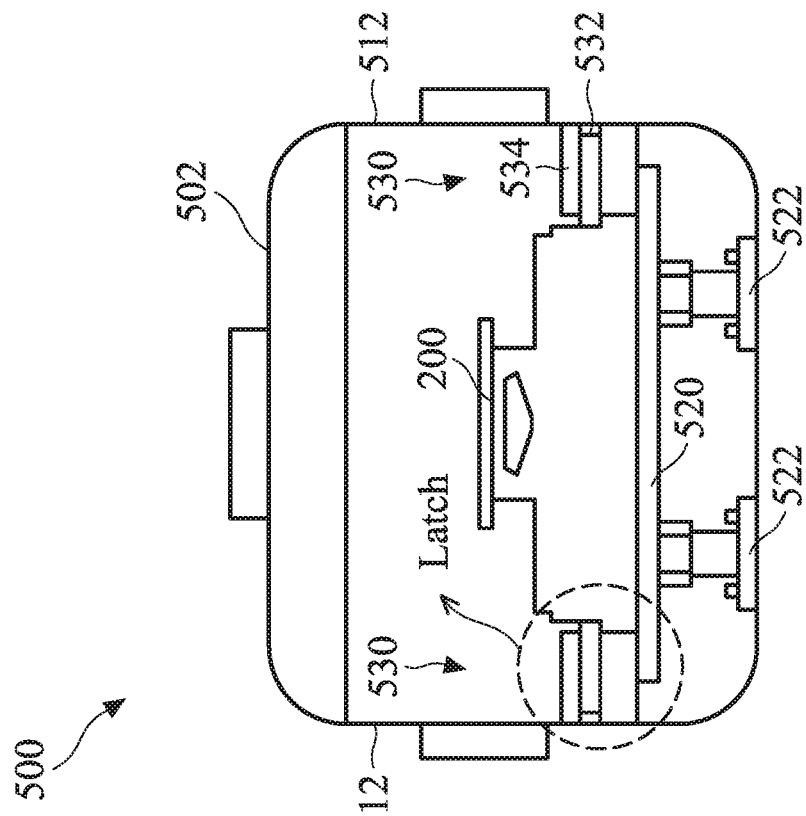
Figure 7B:
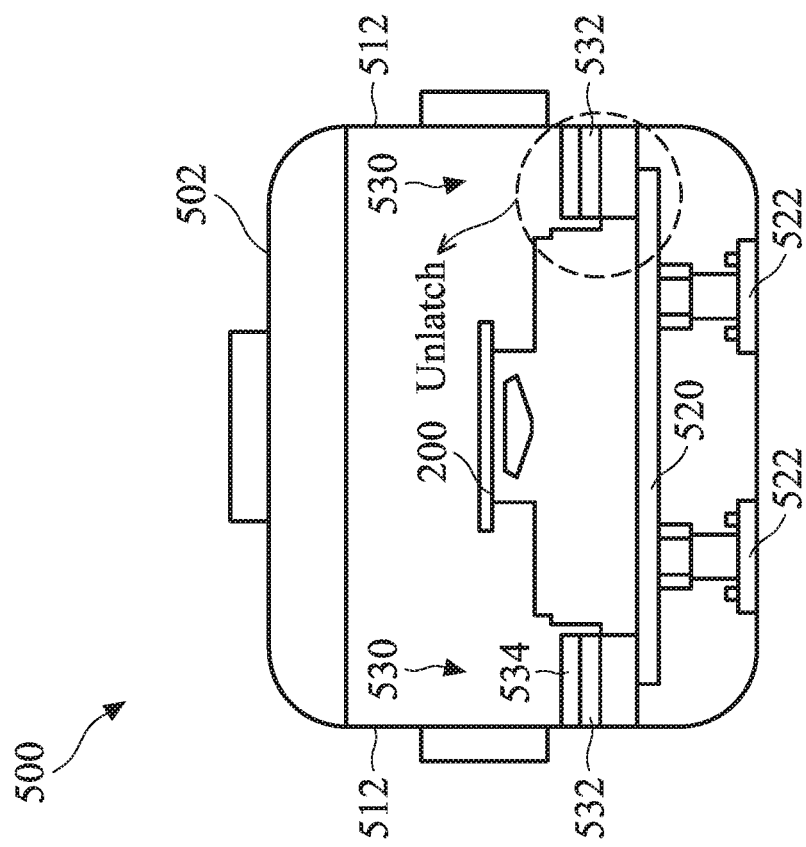

Referring to FIGS. 7A and 7B, the reticle FOUP 500 may include one or more sets of latch mechanism 530 to secure the reticle pod 200 on the receiving stage 520. As an example, two sets of latch mechanism 530 may be mounted on sidewalls 512, one on each side, sandwiching the reticle pod 200 in between. In the illustrated embodiment, the latch mechanism 530 is driven by the lid 504 (FIG. 5A) to shift between a latching condition and an unlatching condition. When the lid 504 is detached from the body 502, the latch mechanism 530 is driven into the unlatching condition and a latch tab 532 is released from the reticle pod 200, as shown in FIG. 7A. The portion of the latch tab 532 in contact with the reticle pod 200 may include elastomer materials, such as rubber. When the lid 504 is closed on the body 502, the latch mechanism 530 is driven into the latching condition, and the latch tab 532 is driven towards and latches (or clamps) the reticle pod 200, as shown in FIG. 7B. In some embodiments, movements of the latch tab 532 are determined by a drive plate 534, which converts positions of the lid 504 to the positions of the latch tab 532.

An exemplary latch mechanism 530 is further illustrated in FIGS. 8A and 8B. FIG. 8A shows top views of two sets of latch mechanisms 530 on each side of the reticle pod 200 transitioning from the unlatching condition to the latching condition. FIG. 8B shows corresponding top and side views of the latch tab 532 and the drive plate 534. The drive plate 534 partially overlaps with the latch tab 532. In some embodiments, the drive plate 534 is spring-loaded. When the drive plate 534 is in its default position, the spring (not shown) is relaxed, and a terminal end 535 of the drive plate 534 extends out of the flange surface 516 of the front opening. The drive plate 534 may further couples to a rail (or track) 536. The rail 536 limits the movement of the drive plate 534 in a front-rear direction (i.e., along X-axis) in respect to the reticle FOUP 500. The latch tab 532 may also be confined by another rail (or track) its movement in a left-right direction (i.e., along Y-axis) in respect to the reticle FOUP 500. The drive plate 534 has a drive pin 562 embedded in a groove 564 opened in the latch tab 532. The groove 564 lies lengthwise in an angle with respect to the front-rear moving direction of the drive plate 534, for example, in an angle Θ of 30°, 45°, or 60°. The drive pin 562 can move upwardly or downwardly along the groove 564. In some embodiments, the latch tab 532 may have the drive pin 562, while the drive plate 534 may have the groove 564 instead. The latch tab 532 can be either under or above the drive plate 534, as long as the drive pin 562 remains embedded in the groove 564.

Still referring to FIGS. 8A and 8B, when the lid 504 is closing, the terminal end 535 of the drive plate 534 starts being compressed by the lid 504. Since the rail 536 limits the positions of the drive plate 534, the drive pin 562 can only move along the X-axis. During the drive pin 562's movement along the X-axis, the drive pin 562 applies a force on a sidewall of the groove 564, which can be decomposed into sub forces including a sub force along the Y-axis. As a result, the latch tab 532 starts moving along the Y-axis towards a sidewall of the retile pod 200. Thereby, the reticle pod 200 is being compressed by two latch tabs 532 from both sides and eventually secured in the center when the lid 504 is closing. The drive pin 562 and the groove 564 collectively convert a linear movement of the drive plate 534 along the X-axis to another linear movement of the latch tab 532 along the Y-axis. If the lid 504 is being open, the drive plate 534 would be no longer compressed by the lid 504 and start being driven by the loaded spring back to its default position. The drive pin 562 applies a force on another sidewall of the groove 564 and thereby presses the latch tab 532 to move away and eventually release from the sidewall of the reticle pod 200. The reticle pod 200 can thus be retrieved from the reticle FOUP 500 after the lid 504 is detached.

Figure 9:
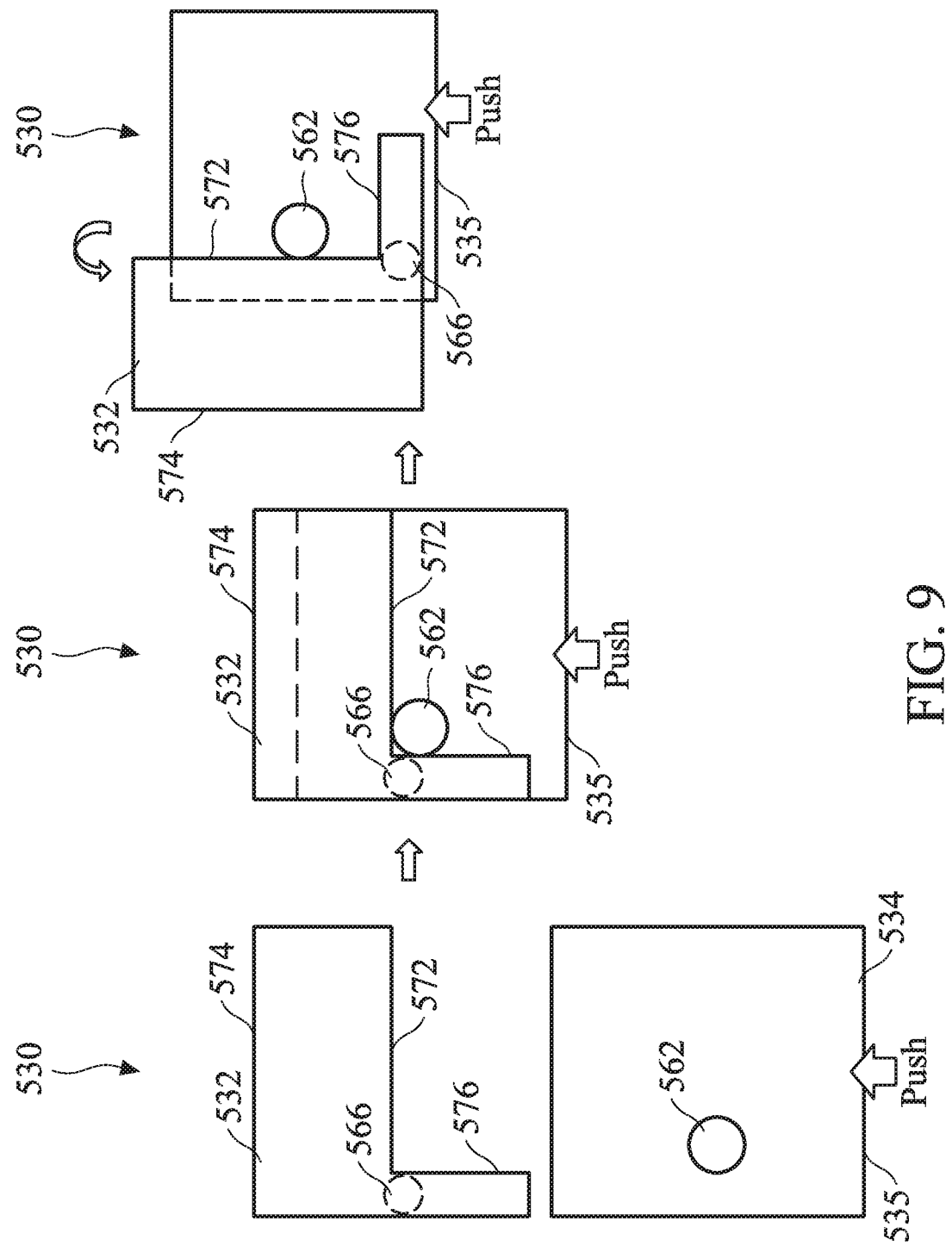

In another embodiment, the latch mechanism 530 has a rotational latch tab 532 on each side of the reticle pod 200. As shown in FIG. 9, the latch tab 532 has a rotary axis 566, circling which the latch tab 532 can make rotational movement. The latch tab 532 may be above the drive plate 534, allowing the drive plate 534 to slide beneath. The drive plate 534 has a drive pin 562, which extrudes from the surface of the drive plate 534 and is able to reach the latch tab 532 above. The drive plate 534 may be loaded by a spring (not shown). When the lid 504 is closing, the drive plate 534 is pushed towards the latch tab 532. As the drive pin 562 touches the latch tab 532, a force is applied on the edge 572 of the latch tab 532. The force pushes the latch tab 532 to start rotating around the rotatory axis 566. As a result, the edge 574 of the latch tab 532 starts moving towards the reticle pod 200. When the lid 504 is fully closed, the drive pin 562 has moved along the edge 572 for some distance, and the latch tab 532 has rotated approximately 90° around the rotatory axis 566. The edge 574 may have elastomer materials, such as rubber, and latch the reticle pod 200. If the lid 504 is being open, the drive plate 534 is no longer compressed by the lid 504 and starts being driven by the loaded spring to move back to its default position. The drive pin 562 thereby starts applying a force on edge 576 of the latch tab 532 instead and pressing the latch tab 532 to rotate around the rotatory axis 566 to travel back to its default position. As a result, the reticle pod 200 is unlatched from the latch mechanism 530 and can be retrieved from the reticle FOUP 500 after the lid 504 is detached.

Figure 10:
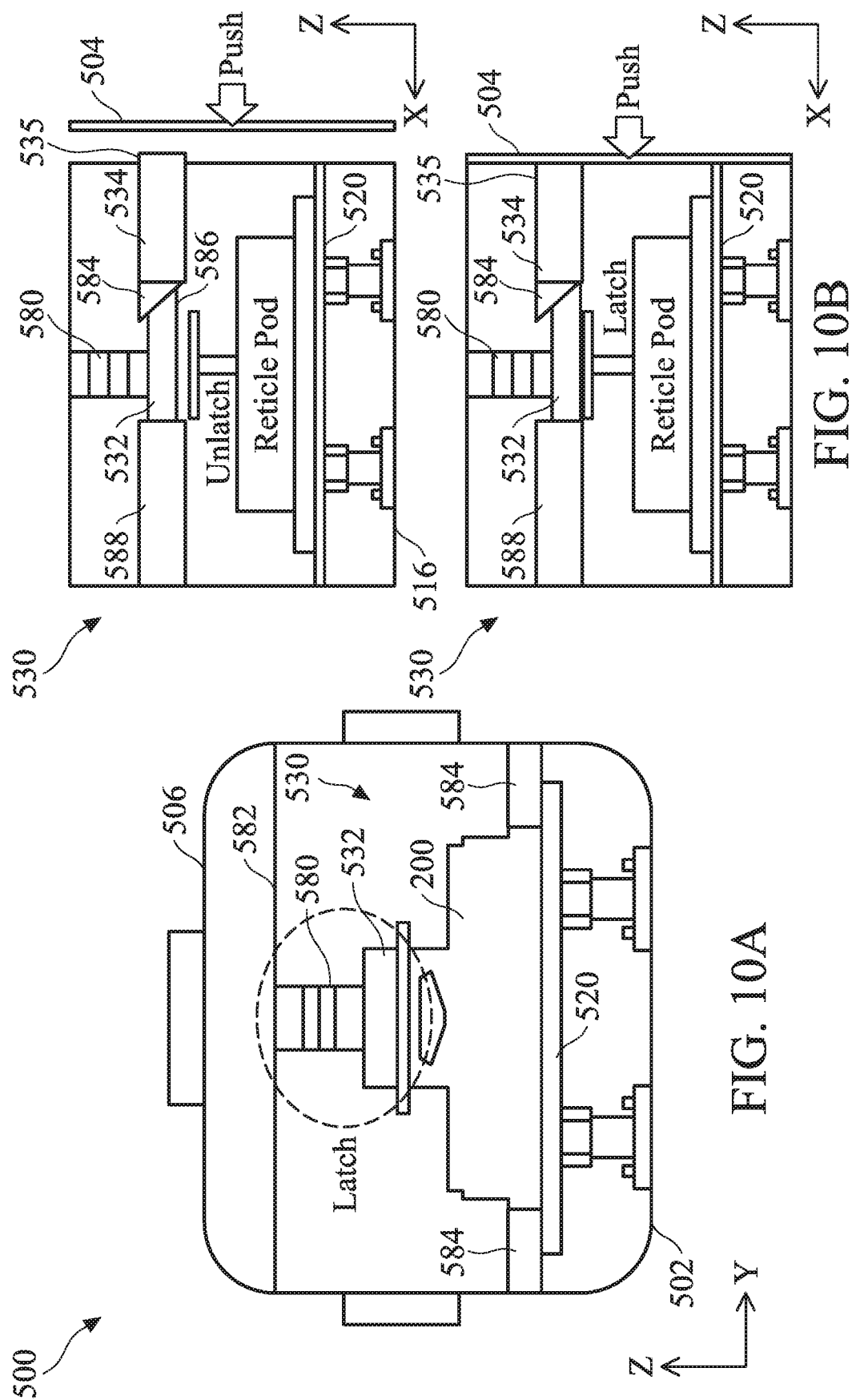

In yet another embodiment, the latch mechanism 530 has a latch tab 532 that can move downwardly to suppress the reticle pod 200 on the receiving stage 520 from above. As shown in FIGS. 10A and 10B for front-view and side-view of the reticle FOUP 500, respectively, the latch tab 532 is hanged above the reticle pod 200. In some embodiments, the latch tab 532 is loaded to a spring 580 to hang on the top plate 506 of the reticle FOUP 500. In some embodiments, the reticle FOUP 500 has a middle plate 582, which is beneath and parallel to the top plate 506, and the latch tab 532 is loaded to the spring 580 to hang on the middle plate 582. Having a middle plate 582 may reduce the required length of the spring 580. Sidewalls of the reticle FOUP 500 may have elastic buffers 584, such as rubber blocks, to clamp the reticle pod 200 in between for securing its position horizontally. The drive plate 534 has a flat terminal end 535 extending out of the boundary of the flange surface 516. The drive plate 534 also has a wedge terminal end 584 interfacing with a wedge terminal end 586 of the latch tab 532. A fixture 588 limits the latch tab 532's movement in an upward-downward direction (i.e., along Z-axis). A rail (or track) limits the drive plate 534's movement along the X-axis. When the lid 504 is closing, the terminal 535 of the drive plate 534 starts being compressed by the lid 504. A force is applied to the latch tab 532 through the wedge terminal ends 584 and 586. Due to the wedge interface, the force can be decomposed into sub forces with one of the sub forces along the Z-axis. Since the latch tab 532's movement is limited along the Z-axis, the latch tab 532 starts extending downwardly towards the reticle pod 200. The spring 580 is also extended during this process. When the lid 504 is completed closed, the latch tab 532 falls on the top surface of the reticle pod 200 and suppresses it on the receiving stage 520 from above. The latch mechanism 530 is thus in the latch condition. When the lid 504 is being open, the spring 580 pulls the latch tab 532 up to its default position. The upward movement of the latch tab 532 also applies a force on the drive plate 534 through the wedge terminals 586 and 584. In some embodiments, the drive plate 534 is not loaded with a spring and relies on the spring-loaded latch tab 532 to push it back to its default position. In some embodiments, the drive plate 534 is also spring-loaded and will be able to retrieve to default position by itself when the lid 504 no long compresses it.

Figure 11:
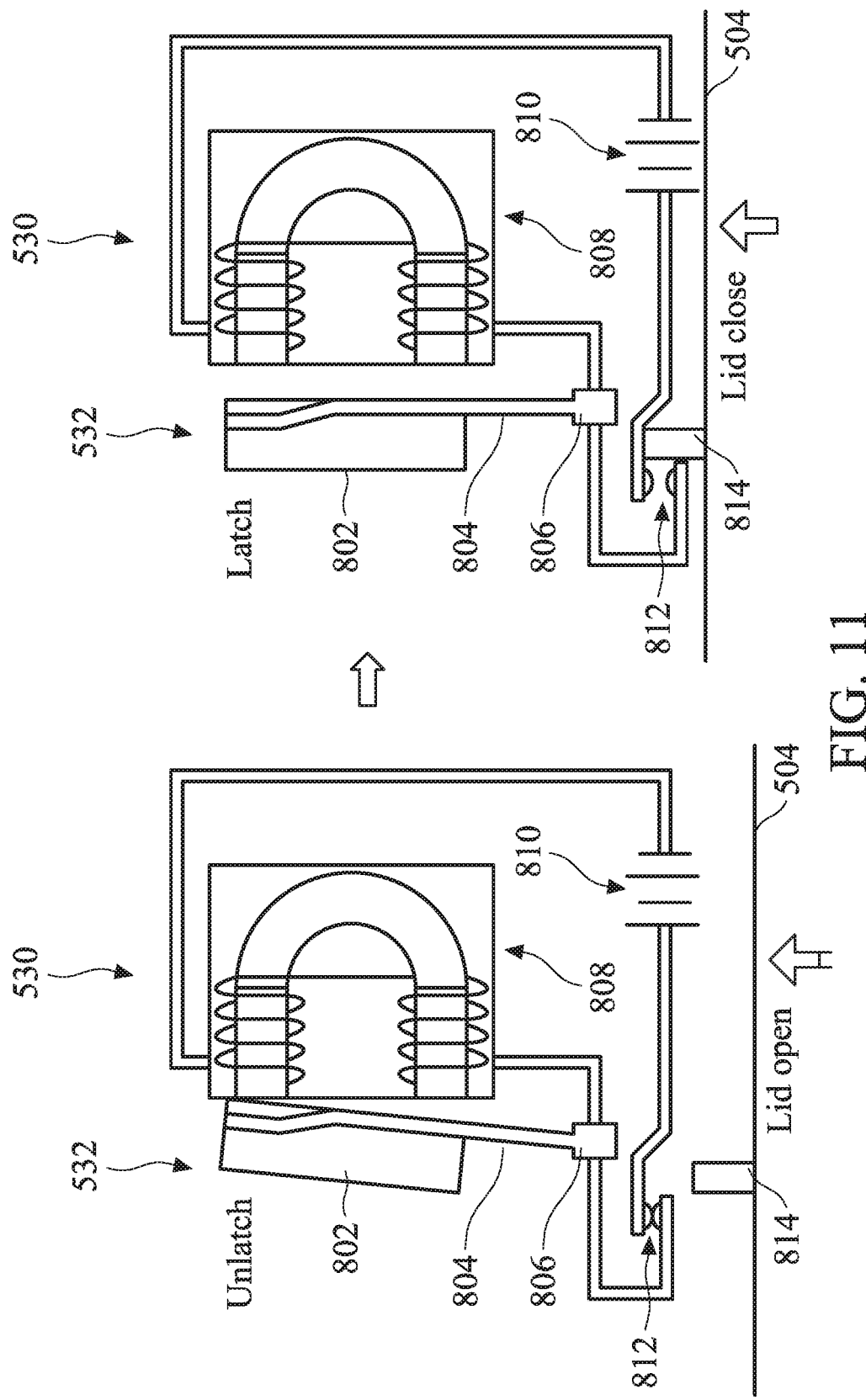

In various embodiments, the latch mechanism 530 may use an electromagnet 808 to drive the latch tab 532, as illustrated in FIG. 11. The latch tab 532 includes an elastomer block 802, such as a rubber block, and a magnetic pole 804. The magnetic pole 804 has one end embedded in the elastomer block 802 and another end connected to an elastic component 806. The magnetic pole 804 may be fully magnetized or just has a top end inside the elastomer block 802 magnetized. The elastic component 806 may have a rotatory axis allowing the latch tab 532 to be forced to rotate in a range of certain degrees. The electromagnet 808 is wired to an onboard battery 810 through a switch 812. The onboard battery 810 may be a rechargeable battery. The onboard battery 810 may be placed inside the compartment of the reticle FOUP 500, such as mounting on sidewalls or the bottom plate. The lid 504 has a tab 814. When the lid 504 is open, the switch 812 remains close and currents run through the coils on the electromagnet 808 and generate a magnetic field. The magnetic pole 804 is attracted to the electromagnetic 808 and the elastomer block 802 is pulled away from a sidewall of the reticle pod 200. The latch mechanism 530 is therefore in an unlatch condition. When the lid 504 is closed, the tab 814 pushes the switch 812 open. As a result, circuit is broken, and no current flows through the electromagnet 808. The magnetic pole 804 loses the attraction force and becomes released. The elastic component 806 rotates the latch tab 532 back to its default position, which latches the reticle pod 200 with the elastomer block 802. The latch mechanism 530 is therefore in a latch condition.

Figure 12:
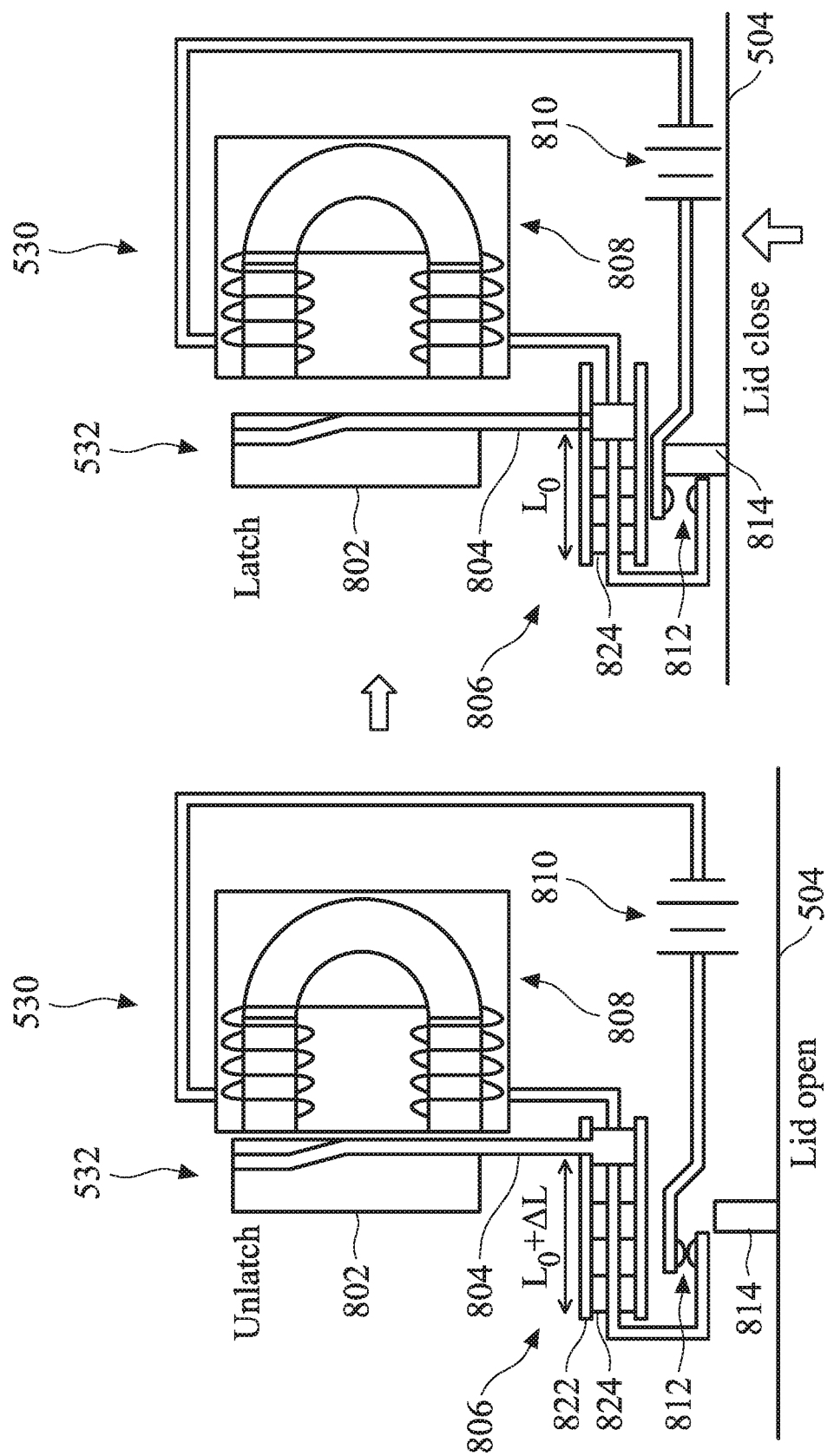
Figure 13:
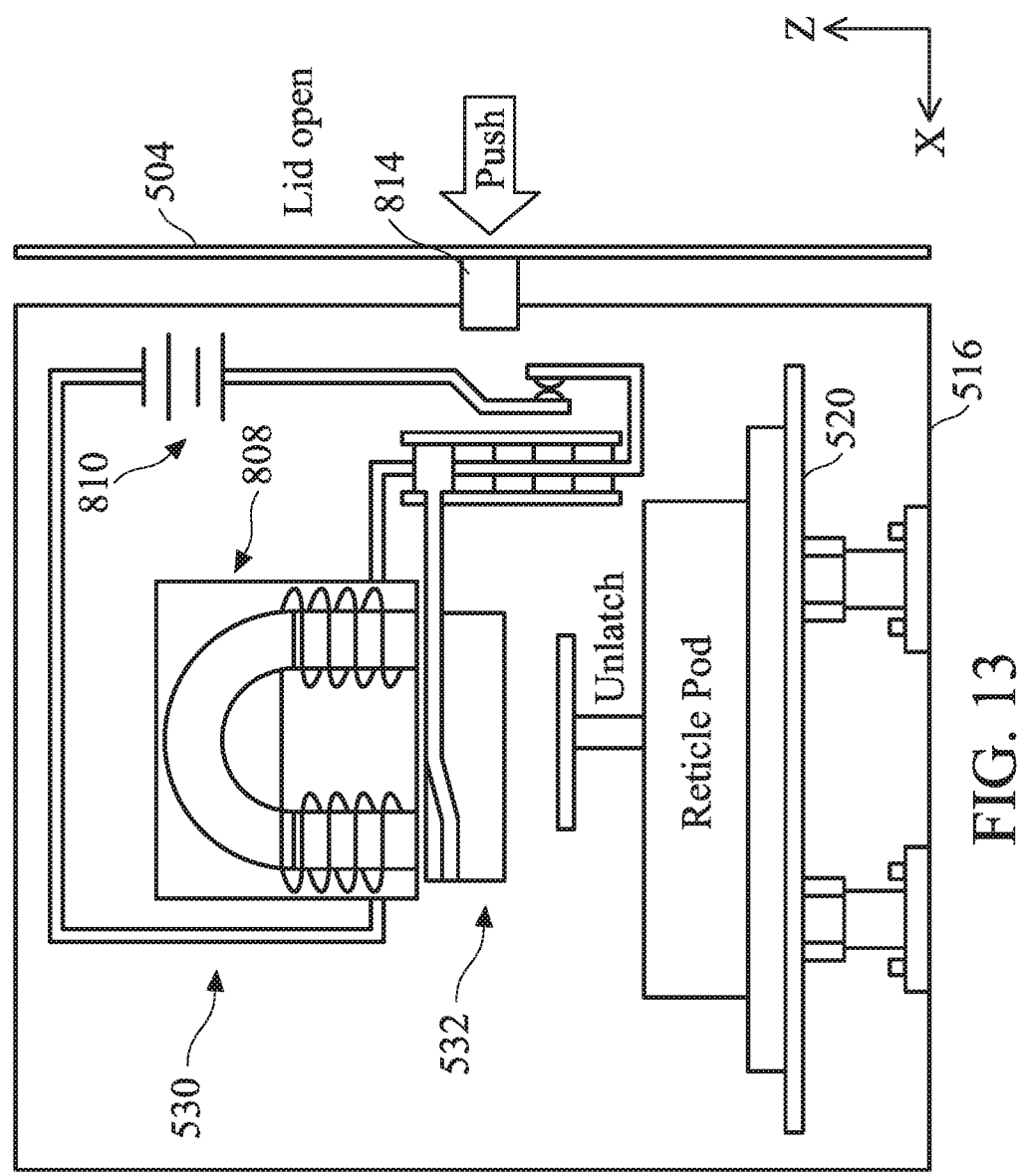

The elastic component 806 may use a sliding device instead of a rotatory axis in an example. As shown in FIG. 12, the elastic component 806 includes a rail 822 and a spring 824 loaded to one end of the magnetic pole 804, which allows the translational movement of the latch tab 532 along the rail 822. When the switch 812 is closed, the latch tab 532 is attracted towards the electromagnet 808. The spring 824 is extended by a distance $\Delta L$. When the switch 812 is pushed open by the lid 814, the electromagnet 808 loses generating the magnetic field, and the latch tab 532 is pulled back to its default position along the rail 822 by the spring 824. The distance $\Delta L$ may range from about 1 cm to about 10 cm in some embodiments. With the sliding device, the latch tab 532 and the electromagnet 808 may be hanged on the top plate of the reticle FOUP 500 instead of on sidewalls. In this scenario, the latch tab 532 may be lifted to release or lowered to suppress a top surface of the retile pod 200 driven by the electromagnet 808. FIG. 13 illustrates such scenario when the latch tab 532 is lifted by the electromagnet 808 and the latch mechanism 530 is in an unlatch condition.

Figure 14:
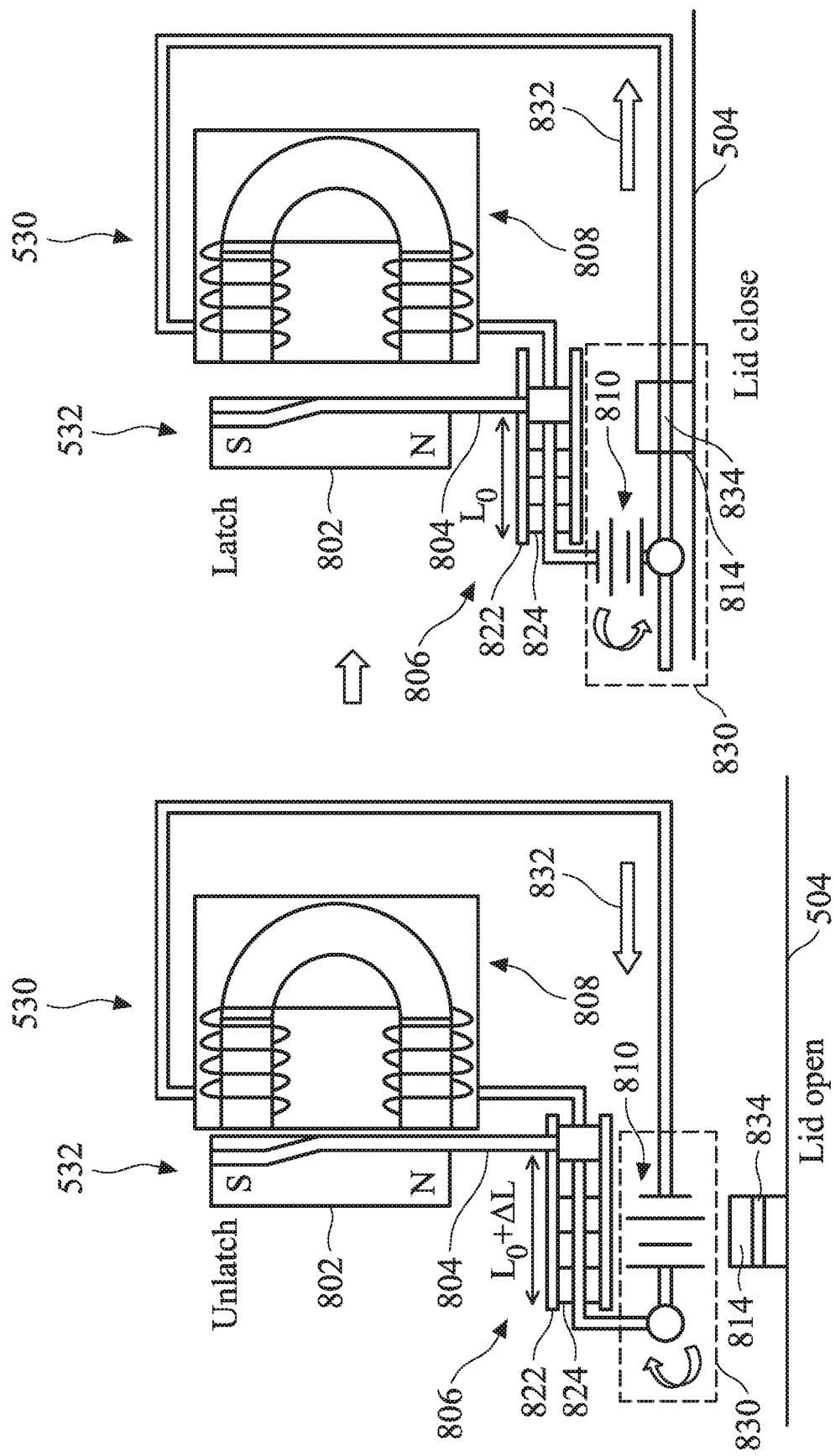

Another example for the latch mechanism 530 using electromagnet 808 is to flip current directions based on lid 504 positions, which causes the polarity of the electromagnet 808 to be reversed. Referring to FIG. 14, the onboard battery 810 is part of a power invertor 830. In some embodiments, the power invertor 830 has a rotatory mechanism allowing polarities of the onboard battery 810 to be inverted. In the illustrated embodiment, when the lid 504 is closing, the tab 814 on the lid 504 pushes the power invertor 830 to flip. As a result, the current direction 832 flowing through the electromagnet 808 is flipped, causing the polarity of the electromagnet 808 to be reversed. The tab 814 may include conductive features 834 that become part of the circuit when the lid 504 is close. As an example, if the latch tab 532 by default (lid open) is attracted by the electromagnet 808, it becomes being repelled by the electromagnet 808 when the lid is close. The latch tab 532 is thus driven towards a sidewall or a top surface of the reticle pod 200, clamping the reticle pod 200 with the elastomer block 802. The elastic component 806 may alternatively include a rotatory axis as the one shown earlier in FIG. 11.

Figure 15:
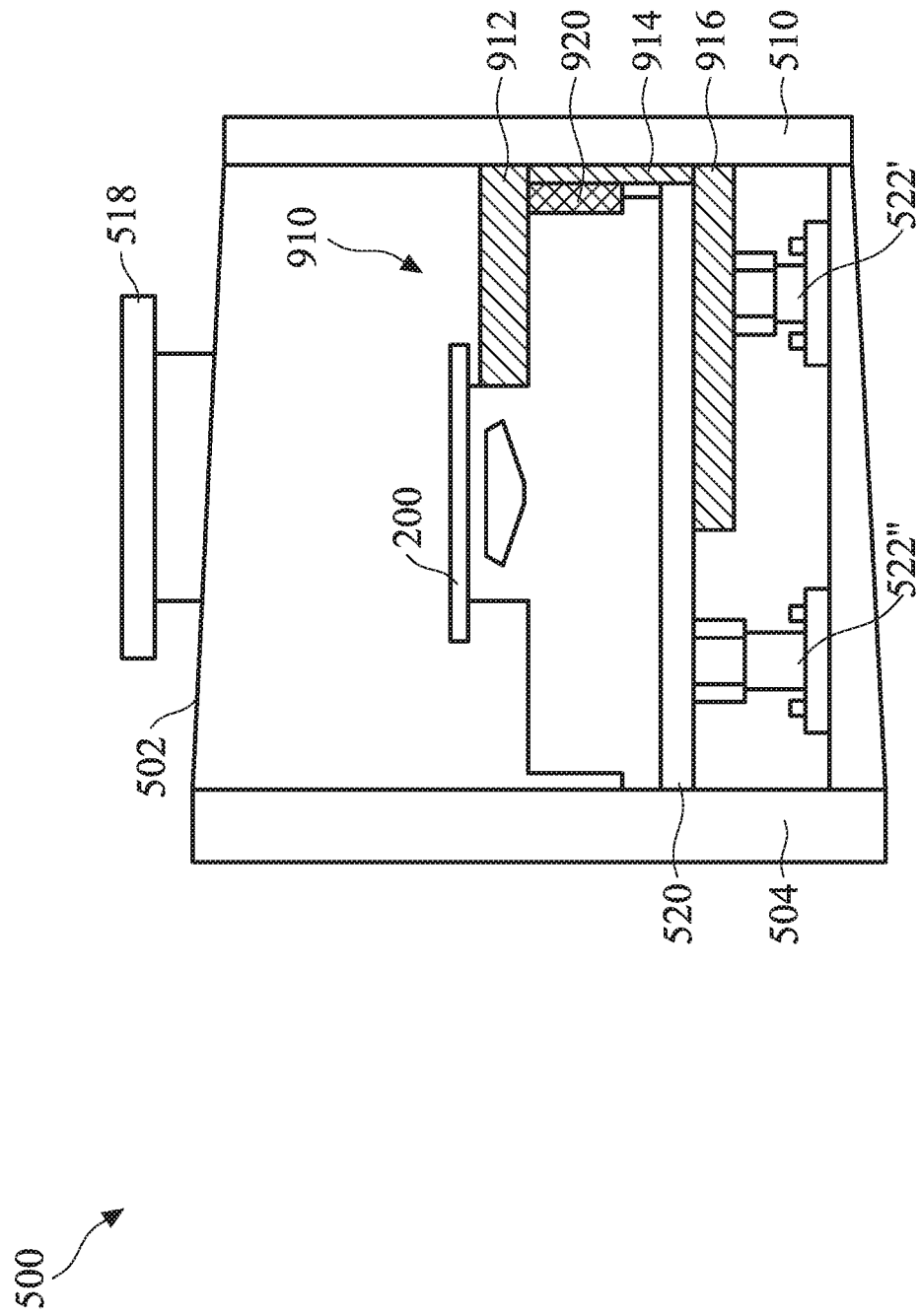
FIG. 15 is a diagram showing clamping devices and elastic buffers in a reticle FOUP for vibration absorption, in accordance with some embodiments.

Referring to FIG. 15, in some embodiments, the receiving stage 520 may have extra clamping device 910 and/or elastic buffers 920 attached for further securing the reticle pod 200 and extra vibration absorption. The clamping device 910 has a clamp top plate 912, a clamp bottom plate 916, and a jointer 914. The jointer 914 may stand against the rear wall 510 and connects to the clamp top plate 912 and the clamp bottom plate 916. The clamp bottom plate 916 may be placed between the receiving stage 520 and some of the pillars 522, such as the pillars 522' near the rear wall 510. To accommodate the bottom plate 916, the pillars 522' in the rear row may be shorter in height than the pillars 522" in the front row. The clamp top plate 912 may use elastomer materials, such as rubber. The distance between the clamp top plate 912 and the receiving stage 520 is roughly the same as the height of the body of the reticle pod 200, but slightly smaller. When the reticle pod 200 is inserted into the space between the clamp top plate 912 and the receiving stage 520, the clamp top plate 912 suppresses the reticle pod 200 to the receiving stage 520 from above. One or more elastic buffers 920 may be placed around the reticle pod 200, sandwiched by the reticle pod 200 and the body 502 for extra vibration absorption. For example, two elastic buffers 920 may be placed at two rear corners of the body 502, against the rear wall 510. The elastic buffers 920 may use rubber, or elastic devices like spring or hydraulic vibration absorber.

FIG. 16 is a flowchart of a method 1600 for reticle transportation, such as an EUV reticle transportation. In some embodiments, the method 1600 is implemented using the OHT system 410 as shown in FIG. 4. It is understood that additional steps can be provided before, during, and after the method 1600, and some steps described can be replaced, eliminated, or moved around for additional embodiments of the method 1600. The method 1600 is an example, and is not intended to limit the disclosure beyond what is explicitly recited in the claims.

At operation 1602, an OHT system is provided. The OHT system includes a network of stationary rails (or tracks) operable to guide the movement of multiple OHT carriers.

The OHT carriers are supported and suspended from the rails. The network of the rails expands from a first location to a second location. The first location and the second location may be on the same floor, different floors, or different buildings inside a FAB. At operation 1604, the method 1600 retrieves a reticle from a reticle stocker located in the first location. The reticle may be an EUV reticle. At operation 1606, the method 1600 encapsulates the reticle in a reticle pod. The reticle pod may be as well stored in the reticle stocker, or in other suitable pod storages. At operation 1608, the method 1600 encapsulates the reticle pod, together with the reticle inside, into a reticle FOUP. The reticle FOUP has external surfaces substantially conforming to a wafer FOUP standard, which enables it to transport in the same OHT system with other wafer FOUPs. The reticle FOUP equips with one or more features selected from, such as a receiving stage, elastic support pillars, latch mechanisms, clamping devices, elastic buffers, or a combination thereof, to secure the reticle pod inside and provide vibration/shock absorption. At operation 1610, the method 1600 lifts the FOUP by an OHT carrier. The OHT carrier may use a gripper to grasp a lift plate of the reticle FOUP for lifting. At operation 1612, the method 1600 transports the reticle FOUP from the first location to the second location along the network of the rails of the OHT system. Concurrently, the OHT system may have multiple other OHT carriers carrying wafer FOUPs containing semiconductor wafers from one location to another. At operation 1614, at the second location, such as at a loadport of a lithography tool, the method 1600 retrieves the reticle pod from the reticle FOUP. The retrieving of the reticle pod may be implemented by a sliding mechanism or a robotic arm. At operation 1616, the method 1600 retrieves the reticle from the reticle pod. At operation 1618, the method 1600 delivers the reticle to the lithography tool for further processing. The lithography tool can be one of any type of lithography processing, metrology, inspection, cleaning, testing tools, or other suitable tools. For example, the lithography tool can be an EUV scanner or an EUV reticle cleaning chamber. The lithography tool includes one or more loadports to facilitate insertion or removal of the reticle or the reticle pod into or out of the lithography tool. For an EUV scanner, it may has a reticle load port and a wafer load port. The wafer load port receives wafers transported by wafer FOUPs through the OHT system concurrently when the reticle pod is transported by the reticle FOUP through the same OHT system.

The present disclosure provides a reticle pod container for reticle transshipment and a method thereof for reticle transshipment automation. Particularly, the reticle transshipment automation reduces a need for traditional reticle manual transportation and reduces chances of particle contamination during reticle handling and transportation. Reticles sensitive to particle contamination, such as EUV reticles, are thereby better preserved and protected by the disclosed reticle pod container and the reticle transshipment automation method thereof.

In one exemplary aspect, the present disclosure is directed to a transportation container, which includes a container body constructed of a top wall, a bottom wall, a rear wall, and two sidewalls forming a front opening for loading or unloading a reticle pod into or out of the container body; a lid for opening and closing the front opening; and a lift plate above the container body configured to connect to a carrier of an overhead hoist transfer (OHT) system. In an embodiment, the reticle pod is an extreme ultraviolet (EUV) reticle pod. In an embodiment, the transportation container further includes a latch mechanism inside the container body configured to latch the reticle pod, the latch mechanism being drivable by the lid to shift between a latching condition when the lid is closed and an unlatching condition when the lid is opened. In an embodiment, the latch mechanism includes a spring-loaded drive plate and a latch tab coupled to the spring-loaded drive plate, the spring-loaded drive plate being drivable by the lid to shift the latch tab between the latching condition and the unlatching condition. In an embodiment, the latch tab has a groove, and the spring-loaded drive plate has a drive pin, the drive pin being movable along the groove, the drive pin and the groove collectively converting a linear movement of the spring-loaded drive plate to a linear movement of the latch tab. In an embodiment, the latch tab has a rotatory axis, and the spring-loaded drive plate has a drive pin, the drive pin driving an edge of the latch tab, the drive pin and the rotatory axis collectively converting a linear movement of the spring-loaded drive plate to a rotatory movement of the latch tab. In an embodiment, the latch tab is spring-loaded to the top wall and moveable downwardly when the lid is closed, and the latching condition includes suppressing a top surface of the reticle pod by the latch tab. In an embodiment, the latch mechanism includes a magnetic latch tab and an electromagnet, the electromagnet being drivable by the lid to attract or repel the magnetic latch tab. In an embodiment, the transportation container further includes an onboard battery to power the electromagnet. In an embodiment, the transportation container further includes a holding plate inside the container body configured to place the reticle pod thereon; and a plurality of pillars on the bottom wall to support the holding plate. In an embodiment, the plurality of pillars includes an elastic mechanism to provide vibration absorption to the holding plate. In an embodiment, the elastic mechanism includes using a rubber vibration absorber, a spring-loaded vibration absorber, or a hydraulic vibration absorber.

In another exemplary aspect, the present disclosure is directed to A system for automated material handling (AMH), which includes a plurality of overhead hoist transfer (OHT) tracks; a first carrier movable along the plurality of OHT tracks; a first front opening universal pod (FOUP) coupled to the first carrier, the first FOUP carrying semiconductor wafers therein; a second carrier movable along the plurality of OHT tracks; and a second FOUP coupled to the second carrier, the second FOUP carrying an extreme ultraviolet (EUV) reticle pod therein. In an embodiment, the EUV reticle pod includes an outer pod and an inner pod, the inner pod being inside the outer pod and configured to encapsulate an EUV reticle. In an embodiment, the second FOUP includes a body, the body enclosing a main compartment with a front opening; a front opening lid for sealingly interfacing with the front opening; a holding plate within the main compartment, the holding plate to hold the EUV reticle pod; and a clamp feature configured to clamp the EUV reticle pod when the front opening lid is attached to the body and unclamp the EUV reticle pod when the front opening lid is detached from the body. In an embodiment, the second FOUP further includes vibration absorbers between the holding plate and the body. In an embodiment, the semiconductor wafers are approximately 300 mm in diameter.

In yet another exemplary aspect, the present disclosure is directed to a method for reticle transportation, which includes providing an overhead hoist transport (OHT) system connecting a first location and a second location; retrieving a reticle from a reticle stocker located in the first location; encapsulating the reticle in a reticle pod; encapsulating the reticle pod in a front opening universal pod (FOUP), wherein the FOUP includes a latch feature to secure the reticle pod therein and a lift feature to couple to a carrier of the OHT system; lifting the FOUP by coupling the lift feature to the carrier; transporting the FOUP from the first location to the second location; retrieving the reticle pod from the FOUP; retrieving the reticle from the reticle pod; and delivering the reticle to a lithography tool located in the second location. In an embodiment, the reticle pod is an extreme ultraviolet (EUV) reticle pod including an outer pod and an inner pod; and during the transportation of the FOUP, the OHT system concurrently couples to another FOUP containing a plurality of semiconductor wafers. In an embodiment, the first location and the second location are located inside two different buildings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transportation container comprising:
   a container body defining an opening for receiving a reticle pod into a cavity of the container body;
   a lid for covering the opening; and
   a latch mechanism coupled to the container body and drivable by the lid to shift between a latching condition to latch the reticle pod and an unlatching condition to unlatch the reticle pod, wherein the latch mechanism includes a drive plate and a latch tab, the drive plate being drivable by the lid to shift the latch tab between the latching condition and the unlatching condition, wherein the drive plate and the latch tab move relative to the container body when the drive plate is driven by the lid, wherein the drive plate and the latch tab move relative to each other when the drive plate is driven by the lid.

2. The transportation container of claim 1, further comprising a connection plate connected to the container body, the connection plate configured to connect to a transport system to transport the transportation container.

3. The transportation container of claim 2, wherein the transport system is an overhead hoist transfer system.

4. The transportation container of claim 1, further comprising:
   a reticle pod stage for holding the reticle pod; and
   a plurality of shock absorbers coupled to the reticle plate.

5. The transportation container of claim 4, wherein the latch tab is configured to rotate about an axis, and
   wherein when the drive plate is driven by the lid to shift the latch tab between the latching condition and the unlatching condition the drive plate interfaces with the latch tab to cause the latch tab to rotate about the axis.

6. The transportation container of claim 4, wherein the latch tab is moveably coupled to a top surface of the container over the reticle pod, the latch tab configured to move along an axis when driven by the drive plate; and
   wherein when the drive plate is driven by the lid to shift the latch tab between the latching condition and the unlatching condition the drive plate interfaces with the latch tab to cause the latch tab to move along the axis.

7. The transportation container of claim 1, wherein one of the latch tab and the drive plate has a groove and the other one of the latch tab and the drive plate has a drive pin, the drive pin and the groove collectively converting a first linear movement of one of the drive plate and the latch tab into a second linear movement of the other one of the drive plate and the latch tab.

8. The transportation container of claim 7, wherein the first linear movement is along a first axis and the second linear movement is along a second axis that is different than the first axis.

9. The transportation container of claim 1, wherein the latch tab includes a magnetic latch tab, and
   wherein the drive plate includes an electromagnet, the electromagnet being drivable by the lid to attract or repel the magnetic latch tab.

10. A system for a transportation container, the system comprising:
    a transportation network for moving transportation containers around the transportation network; and
    a first transportation container transported by the transportation network, the first transportation container including:
      a container body defining an opening for loading or unloading a reticle pod into a cavity of the container body;
      a lid for covering the opening; and
      a latch mechanism configured to latch the reticle pod, the latch mechanism being drivable by lid to shift between a latching condition to latch the reticle pod and an unlatching condition to unlatch the reticle pod, wherein the latch mechanism includes a magnetic latch tab and an electromagnet, the electromagnet being drivable by the lid to attract or repel the magnetic latch tab.

11. The system of claim 10, wherein the transportation network includes a plurality of tracks designed to transport the first transportation carrier, the plurality of track guiding the first transportation carrier from a first location to a second location.

12. The system of claim 11, wherein the first location includes a first processing tool that utilizes a reticle from the reticle pod and the second location includes a second processing tool that utilizes the reticle from the reticle pod.

13. The system of claim 10, further comprising a first carrier that couples first transportation container to the transportation network, the first carrier operable to transport the first transportation container around the transportation network.

14. The system of claim 10, further comprising a second transportation carrier transported by the transportation network, the second transportation carrier including:
    a container body defining an opening for loading or unloading a reticle pod into a cavity of the container body;
    a lid for covering the opening; and
    a latch mechanism coupled to the container body and drivable by the lid to shift between a latching condition to latch the reticle pod and an unlatching condition to unlatch the reticle pod, wherein the latch mechanism includes a drive plate and a latch tab, the drive plate being drivable by the lid to shift the latch tab between the latching condition and the unlatching condition, wherein the drive plate and the latch tab move relative to the container body when the drive plate is driven by the lid, wherein the drive plate and the latch tab move relative to each other when the drive plate is driven by the lid.

15. The system of claim 10, further comprising a second transportation carrier transported by the transportation network, the second transportation carrier including a front opening universal pod (FOUP) carrying semiconductor wafers.

16. The system of claim 10, wherein the reticle pod is an extreme ultraviolet reticle pod.

17. A method comprising:
 positioning a reticle in a reticle pod; and
 positioning the reticle pod in a first front opening universal pod (FOUP), wherein the FOUP includes a lid for revealing an opening of the FOUP and a latch feature to contain the reticle pod within the FOUP, wherein positioning the reticle pod in the FOUP includes moving the lid to drive the latch feature to contain the reticle pod therein, wherein the latch feature includes a magnetic latch tab and an electromagnet, the electromagnet being drivable by the lid to attract or repel the magnetic latch tab.

18. The method of claim 17, transporting the first FOUP from a first location that includes a first processing tool to a second location that includes a second processing tool via an automated transportation network, the first processing tool and the second processing tool both utilizing the reticle from the FOUP and the first processing tool being different than the second processing tool.

19. The method of claim 18, further comprising:
 positioning a semiconductor wafer into a second FOUP; and
 transporting the second FOUP to one or more locations via the automated transportation network.

20. The method of claim 19, wherein the automated transportation network includes an overhead hoist transport (OHT) system.

* * * * *